(12) United States Patent
Song et al.

(10) Patent No.: US 11,961,914 B2
(45) Date of Patent: Apr. 16, 2024

(54) INTEGRATED CIRCUIT DEVICES AND METHODS OF MANUFACTURING THE SAME

(71) Applicant: Samsung Electronics Co., Ltd., Suwon-si (KR)

(72) Inventors: Seungmin Song, Hwaseong-si (KR); Junbeom Park, Seoul (KR); Bongseok Suh, Seoul (KR); Junggil Yang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/321,962

(22) Filed: May 23, 2023

(65) Prior Publication Data
US 2023/0290881 A1 Sep. 14, 2023

Related U.S. Application Data

(63) Continuation of application No. 17/545,072, filed on Dec. 8, 2021, now Pat. No. 11,699,759, which is a
(Continued)

(30) Foreign Application Priority Data

May 27, 2019 (KR) .......................... 10-2019-0062057

(51) Int. Cl.
*H01L 29/78* (2006.01)
*H01L 21/8234* (2006.01)
(Continued)

(52) U.S. Cl.
CPC .... *H01L 29/785* (2013.01); *H01L 21/823431* (2013.01); *H01L 27/0886* (2013.01);
(Continued)

(58) Field of Classification Search
CPC .......... H01L 29/785; H01L 21/823431; H01L 27/0886; H01L 29/42392; H01L 29/66545;
(Continued)

(56) References Cited

U.S. PATENT DOCUMENTS 7,402,483 B2 7/2008 Yun et al.
9,991,352 B1 6/2018 Frougier et al.
(Continued)

OTHER PUBLICATIONS

Jan et al. "A 14 nm SoC Platform Technology Featuring 2nd Generation Tri-Gate Transistors, 70 nm Gate Pitch, 52 nm Metal Pitch, and 0.0499 um2 SRAM cells, Optimized for Low Power, High Performance and High Density SoC Products" Symposium on VLSI Technology Digest of Technical Papers (2 pages) (2015).

*Primary Examiner* — Robert G Bachner
(74) *Attorney, Agent, or Firm* — Myers Bigel, P.A.

(57) ABSTRACT

Integrated circuit devices including a fin shaped active region and methods of forming the same are provided. The devices may include a fin shaped active region, a plurality of semiconductor patterns on the fin shaped active region, a gate electrode on the plurality of semiconductor patterns, and source/drain regions on opposing sides of the gate electrode, respectively. The gate electrode may include a main gate portion extending on an uppermost semiconductor pattern and a sub-gate portion extending between two adjacent ones of the plurality of semiconductor patterns. The sub-gate portion may include a sub-gate center portion and sub-gate edge portions. In a horizontal cross-sectional view, a first width of the sub-gate center portion in a first direction may be less than a second width of one of the sub-gate edge portions in the first direction.

19 Claims, 32 Drawing Sheets

Related U.S. Application Data continuation of application No. 16/743,206, filed on Jan. 15, 2020, now Pat. No. 11,227,952.

(51) Int. Cl.
    *H01L 27/088* (2006.01)
    *H01L 29/423* (2006.01)
    *H01L 29/66* (2006.01)

(52) U.S. Cl.
    CPC .. *H01L 29/42392* (2013.01); *H01L 29/66545* (2013.01); *H01L 29/66795* (2013.01)

(58) Field of Classification Search
    CPC ........... H01L 29/66795; H01L 29/7831; H01L 29/78696; H01L 29/66636; H01L 27/0207; H01L 21/823487; H01L 29/66477; H01L 29/7855; H01L 27/0924; H01L 21/823807; H01L 21/823814; H01L 21/823821; H01L 21/823864; H01L 27/1211; H01L 29/7848
    See application file for complete search history.

(56) References Cited

U.S. PATENT DOCUMENTS

| | | |
|---|---|---|
| 10,008,575 B2 | 6/2018 | Suh et al. |
| 10,211,307 B2 | 2/2019 | Ching et al. |
| 2015/0372104 A1 | 12/2015 | Liu et al. |
| 2017/0213888 A1 | 7/2017 | Chang et al. |
| 2018/0175035 A1 | 6/2018 | Yang et al. |
| 2019/0006485 A1 | 1/2019 | Kim et al. |
| 2019/0157444 A1* | 5/2019 | Yang ............... H01L 21/823431 |

* cited by examiner

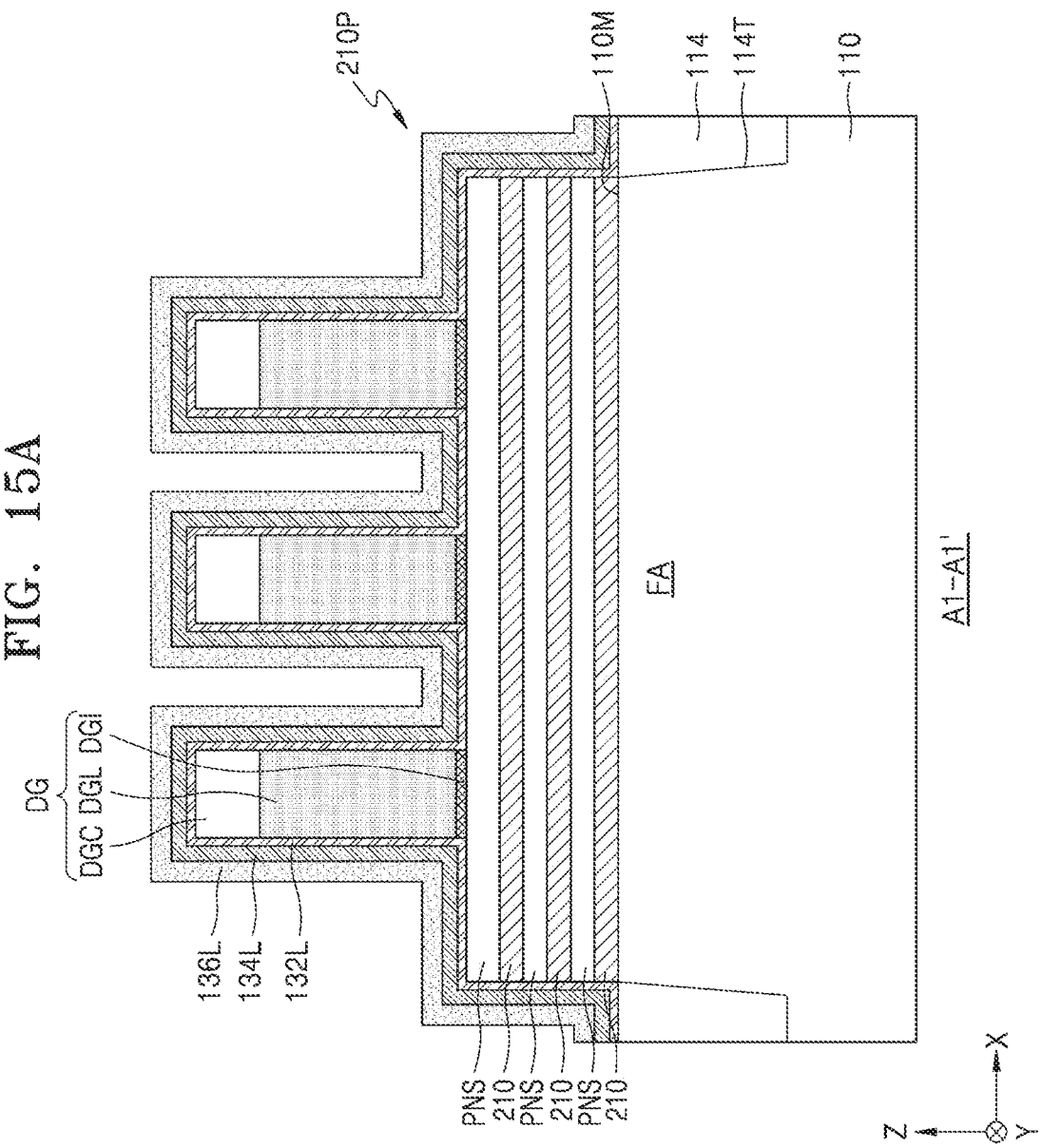

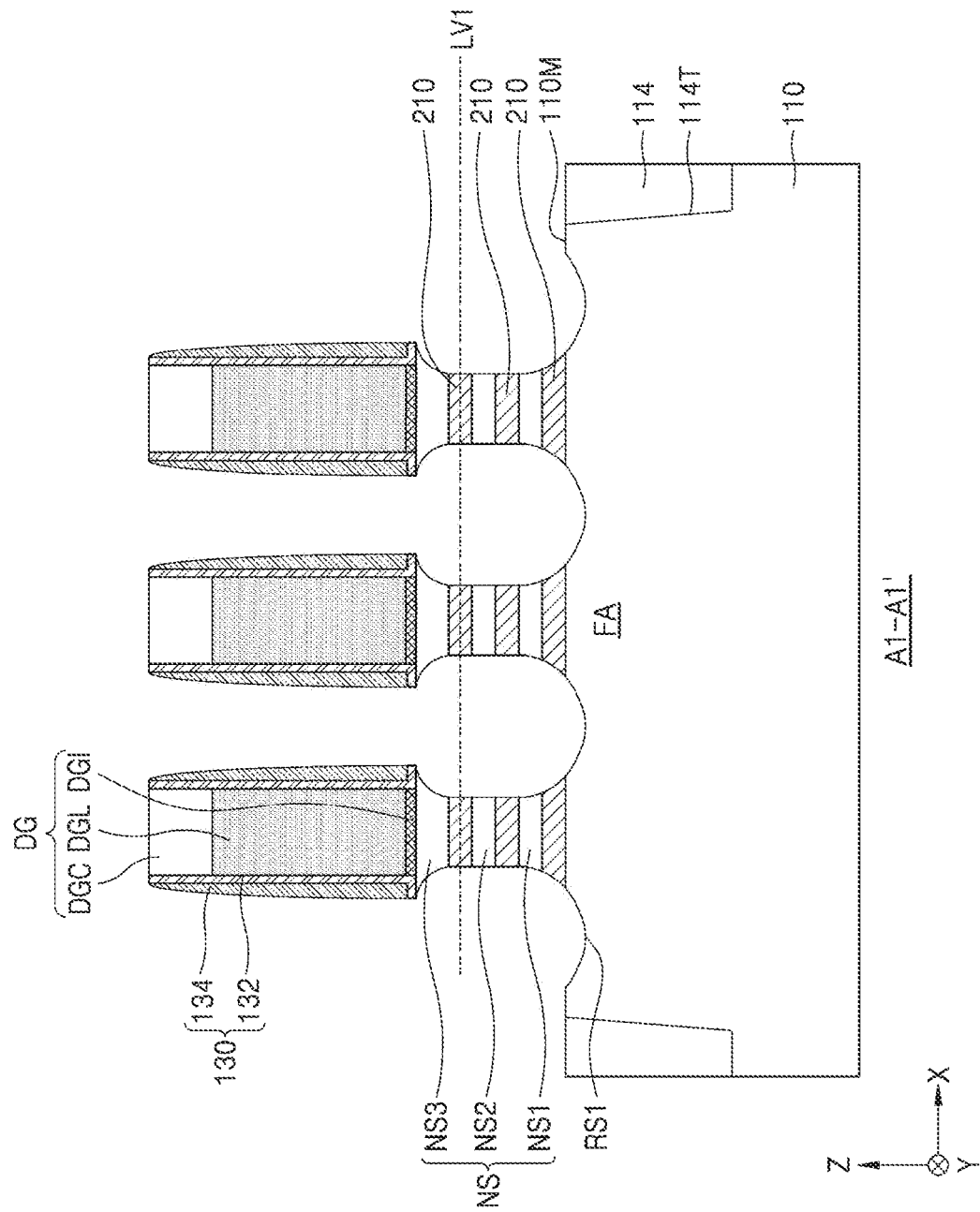

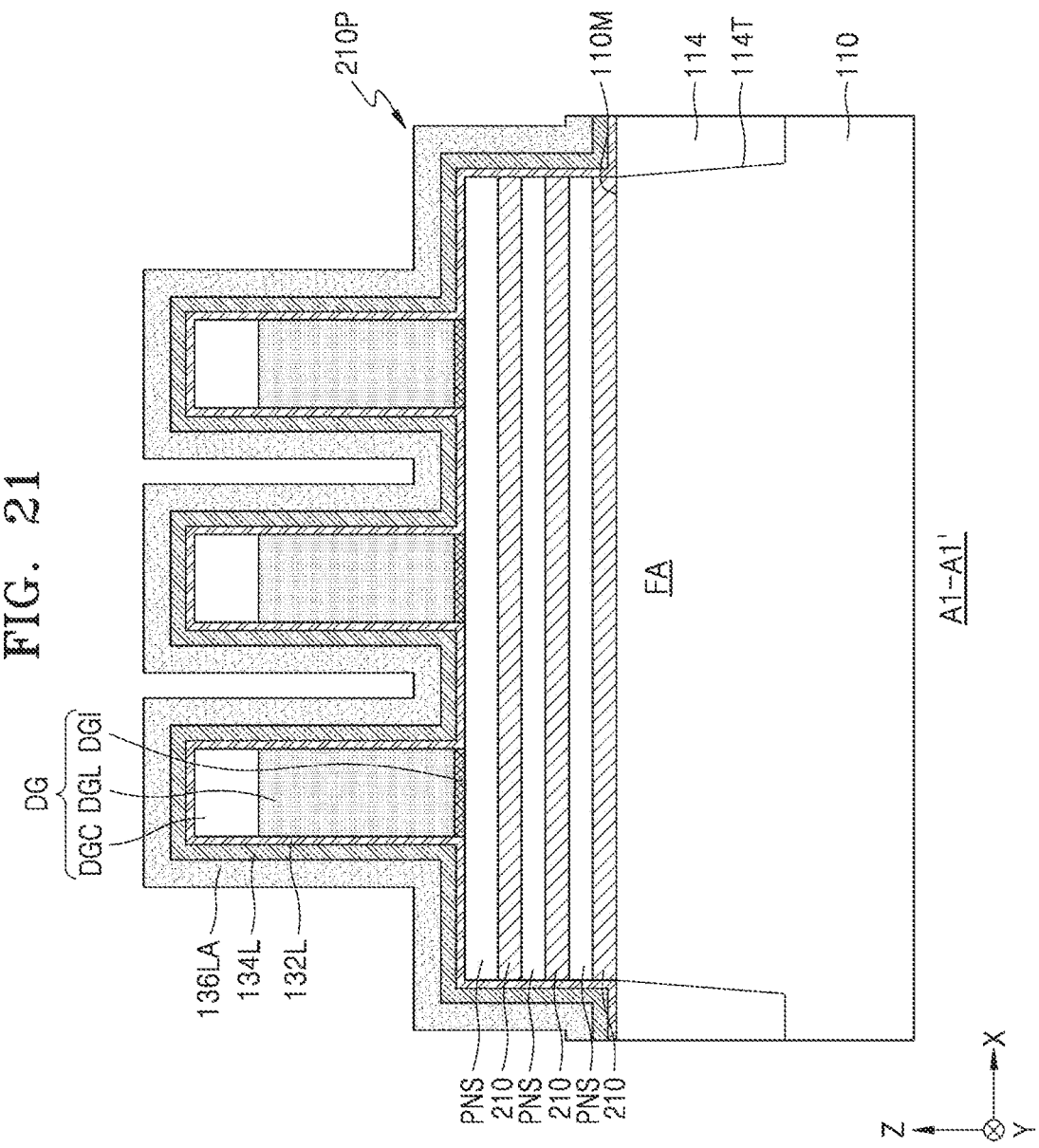

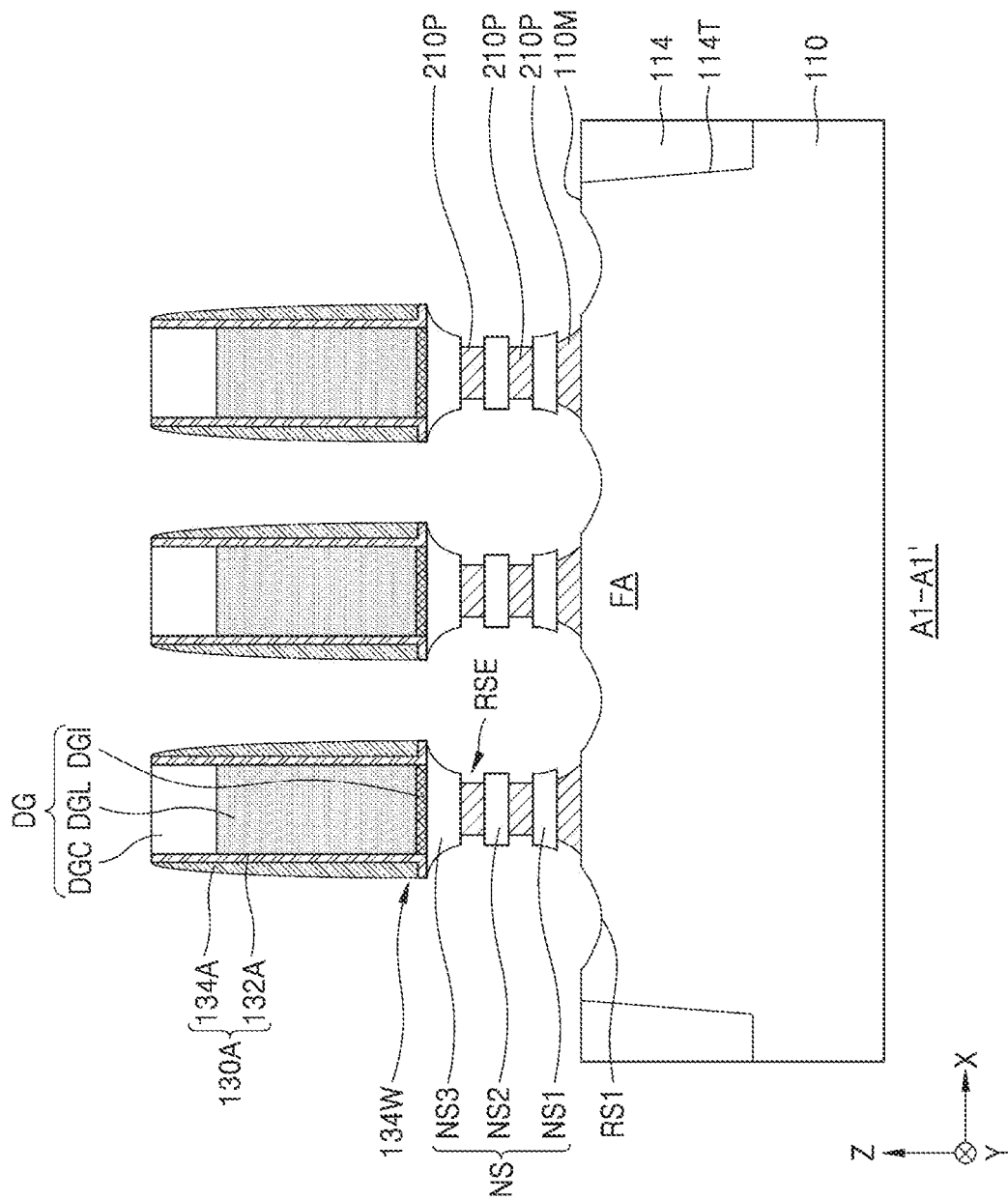

INTEGRATED CIRCUIT DEVICES AND METHODS OF MANUFACTURING THE SAME

CROSS-REFERENCE TO RELATED APPLICATIONS

This application is a continuation of and claims priority U.S. patent application Ser. No. 17/545,072, filed Dec. 8, 2021, which is a continuation of and claims priority to U.S. patent application Ser. No. 16/743,206, filed on Jan. 15, 2020, which claims priority under 35 U.S.C. § 119 to Korean Patent Application No. 10-2019-0062057, filed on May 27, 2019, in the Korean Intellectual Property Office, the disclosures of which are incorporated herein in their entireties by reference.

BACKGROUND

The inventive concept relates to integrated circuit devices and methods of manufacturing the same, and more particularly, to integrated circuit devices including a transistor having a multi-gate structure and methods of manufacturing the integrated circuit devices.

As electronic technology advances, demand for high integration of integrated circuit devices is increasing, and integrated circuit devices are being downscaled. Due to the downscaling of integrated circuit devices, a short channel effect of a transistor may occur and reliability of the integrated circuits may become deteriorated. Integrated circuit devices having a multi-gate structure such as nano-sheet type transistors have been proposed for decreasing the short channel effect.

SUMMARY

The inventive concept provides integrated circuit devices that reduce or are free of leakage current between a source/drain region and a gate electrode.

The inventive concept also provides methods of manufacturing an integrated circuit device, which may reduce or prevent a defect or a failure, such as an undesired connection between a source/drain region and a gate electrode, from occurring during a manufacturing process.

According to example embodiments of the inventive concept, integrated circuit devices may include a fin shaped active region protruding from a substrate and extending in a first direction and a plurality of semiconductor patterns that are on and are spaced apart from an upper surface of the fin shaped active region. The plurality of semiconductor patterns may include a channel region and an uppermost semiconductor pattern that is a farthest one of the plurality of semiconductor patterns from the upper surface of the fin shaped active region. The integrated circuit devices may also include a gate electrode extending on the plurality of semiconductor patterns in a second direction that is perpendicular to the first direction and source/drain regions that are on opposing sides of the gate electrode, respectively, and are connected to the plurality of semiconductor patterns. The gate electrode may include a main gate portion that extends on the uppermost semiconductor pattern in the second direction and a sub-gate portion that is between two adjacent ones of the plurality of semiconductor patterns. The sub-gate portion may include a sub-gate center portion and sub-gate edge portions that are spaced apart from each other in the second direction and include opposing end portions of the sub-gate portion, respectively. In a first horizontal cross-sectional view, a first width of the sub-gate center portion in the first direction may be less than a second width of one of the sub-gate edge portions in the first direction.

According to example embodiments of the inventive concept, integrated circuit devices may include a fin shaped active region protruding from a substrate and extending in a first direction and a plurality of semiconductor patterns that are on and are spaced apart from an upper surface of the fin shaped active region. The plurality of semiconductor patterns may include a channel region and an uppermost semiconductor pattern that is a farthest one of the plurality of semiconductor patterns from the upper surface of the fin shaped active region. The integrated circuit devices may also include a gate electrode extending on the plurality of semiconductor patterns in a second direction that is perpendicular to the first direction and source/drain regions that are on opposing sides of the gate electrode, respectively, and are connected to the plurality of semiconductor patterns. The gate electrode may include a main gate portion that extends on the uppermost semiconductor pattern in the second direction and a sub-gate portion that is between two adjacent ones of the plurality of semiconductor patterns. Each of the source/drain regions may include a protrusion portion protruding toward the gate electrode. Each of opposing edge portions of the sub-gate portion in the second direction may include a tail portion adjacent to a respective one of the source/drain regions.

According to example embodiments of the inventive concept, integrated circuit devices may include a fin shaped active region protruding from a substrate and extending in a first direction and a plurality of semiconductor patterns that are on and are spaced apart from an upper surface of the fin shaped active region. The plurality of semiconductor patterns may include a channel region and an uppermost semiconductor pattern that is a farthest one of the plurality of semiconductor patterns from the upper surface of the fin shaped active region. The integrated circuit devices may also include a gate electrode extending on the plurality of semiconductor patterns in a second direction that is perpendicular to the first direction and source/drain regions that are on opposing sides of the gate electrode, respectively, and are connected to the plurality of semiconductor patterns. The gate electrode may include a main gate portion that extends on the uppermost semiconductor pattern in the second direction and a sub-gate portion that is between two adjacent ones of the plurality of semiconductor patterns. The sub-gate portion may have a dumbbell shaped horizontal cross-sectional surface.

According to example embodiments of the inventive concept, methods of manufacturing an integrated circuit device may include alternately forming a plurality of channel semiconductor layers and a plurality of sacrificial layers on a substrate to form a sacrificial layer pattern that extends in a first direction parallel to an upper surface of the substrate, forming a dummy gate structure extending in a second direction that is perpendicular to the first direction on the sacrificial layer pattern, forming a spacer structure on a sidewall of the dummy gate structure, forming a recess by removing a portion of the sacrificial layer pattern adjacent to an outer sidewall of the spacer structure, forming a source/drain region in the recess, and replacing the plurality of sacrificial layers with a gate electrode. Each of the plurality of channel semiconductor layers may have a dumbbell shaped horizontal cross-sectional surface after forming the recess.

BRIEF DESCRIPTION OF THE DRAWINGS

Example embodiments of the inventive concept will be more clearly understood from the following detailed description taken in conjunction with the accompanying drawings in which:

FIGS. 13 to 20B are cross-sectional views illustrating a method of manufacturing an integrated circuit device, according to some example embodiments; FIGS. 13, 14A, 15A, 16, 17A, 18A, 19A, and 20A are diagrams illustrating cross-sectional surfaces corresponding to a cross-sectional surface taken along line A1-A1' of FIG. 1, FIGS. 14B, 15B, 19B, and 20B are diagrams illustrating cross-sectional surfaces corresponding to a cross-sectional surface taken along line B1-B1' of FIG. 1, and FIGS. 17B and 18B are diagrams illustrating horizontal cross-sectional surfaces at a first vertical level LV1 of FIG. 17A;

FIGS. 21 to 22B are schematic diagrams illustrating a method of manufacturing an integrated circuit device, according to example embodiments; and FIGS. 23 to 25 are schematic diagrams illustrating a method of manufacturing an integrated circuit device, according to example embodiments.

DETAILED DESCRIPTION

Hereinafter, example embodiments of the inventive concept will be described in detail with reference to the accompanying drawings.

Figure 1:
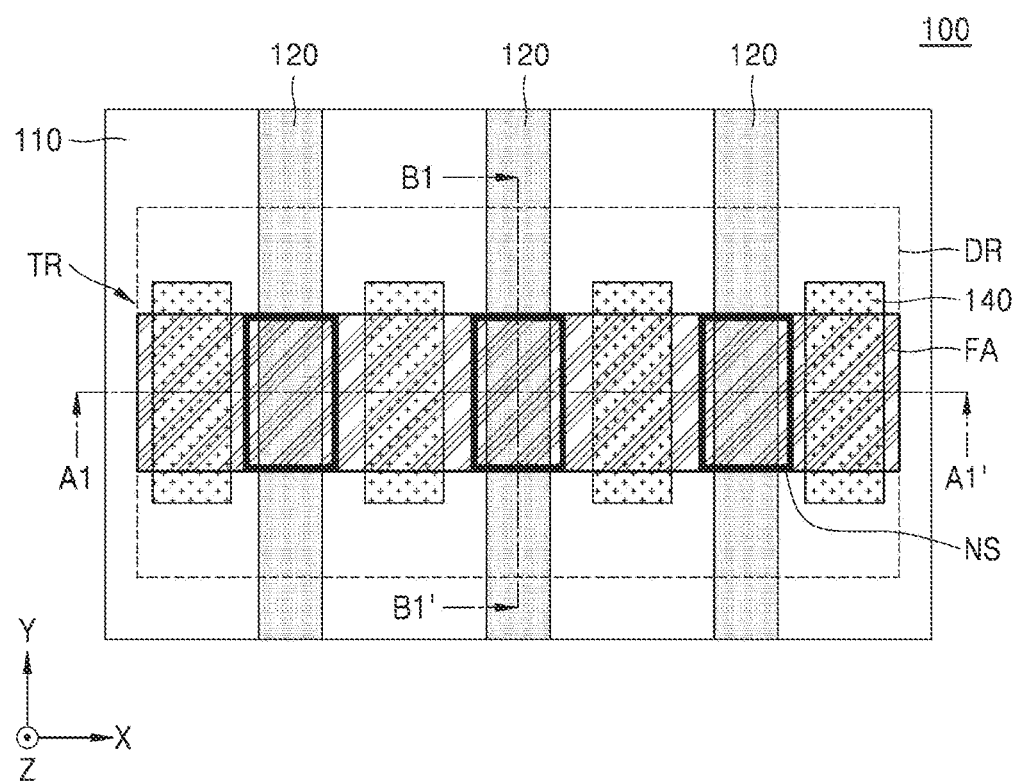
FIG. 1 is a layout illustrating an integrated circuit device according to example embodiments.
Figure 2:
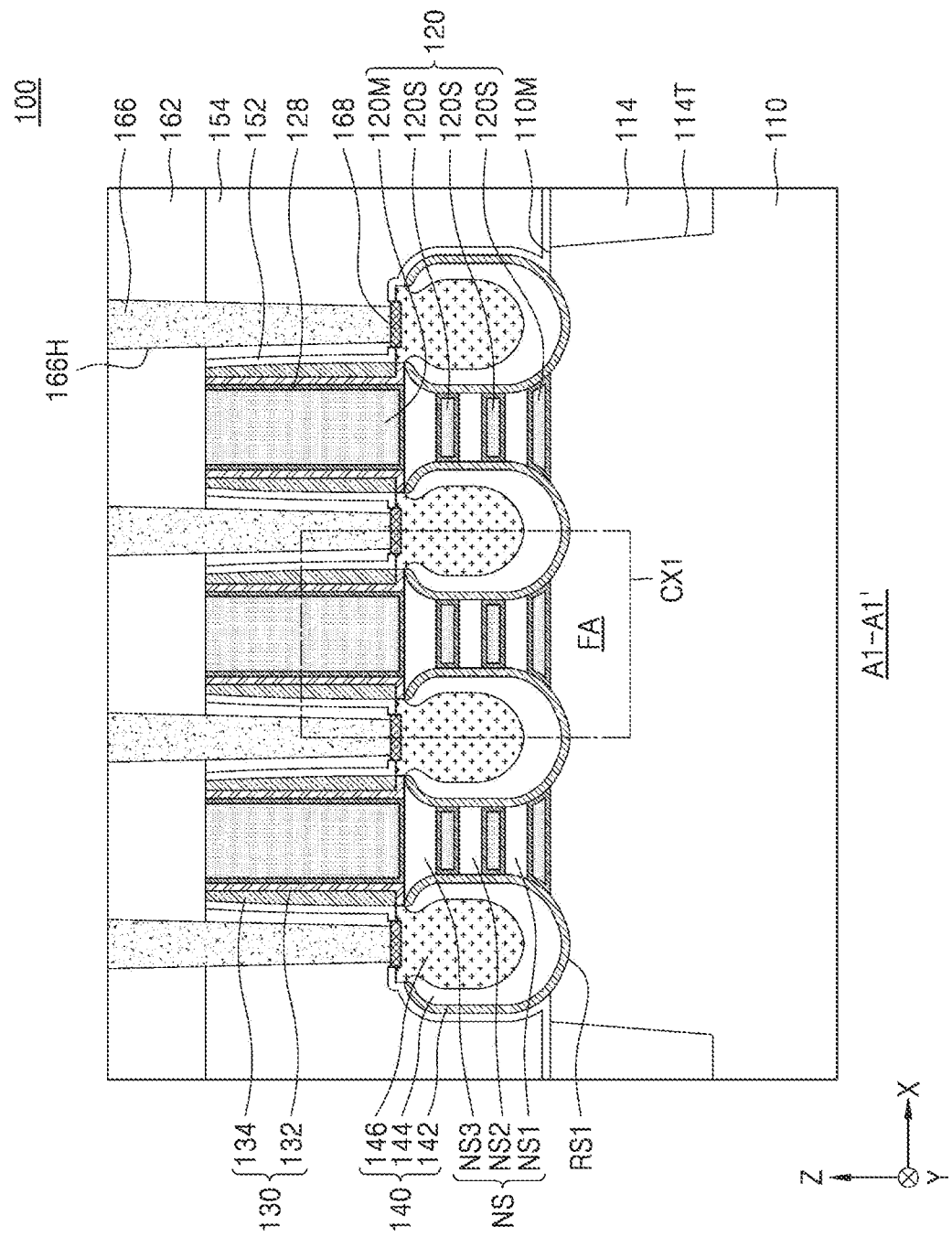
FIG. 2 is a cross-sectional view taken along line A1-A1' of FIG. 1.
Figure 3:
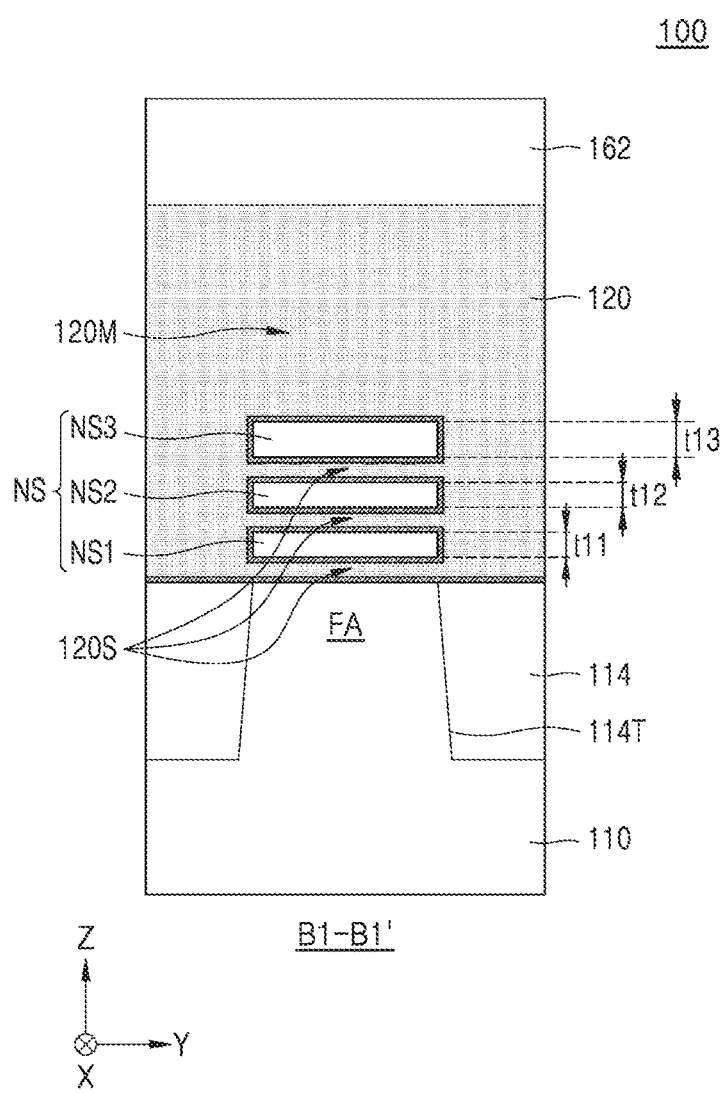
FIG. 3 is a cross-sectional view taken along line B1-B1' of FIG. 1.
Figure 4:
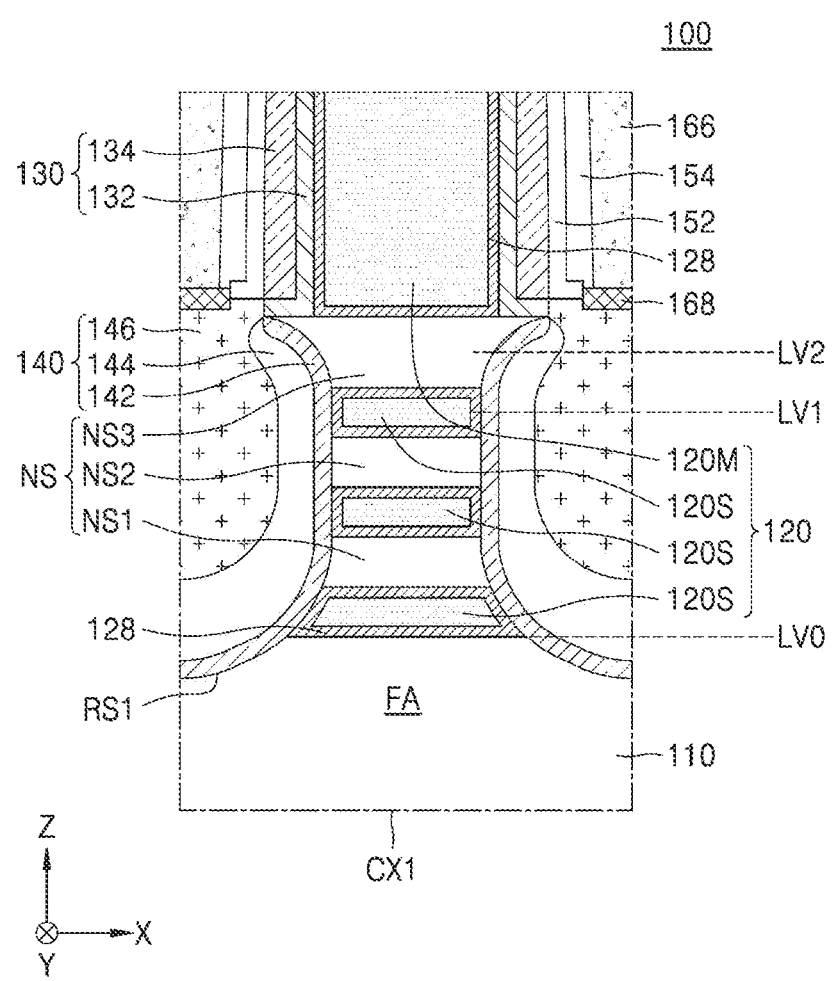
FIG. 4 is an enlarged view of a portion CX1 of FIG. 2.
Figure 5:
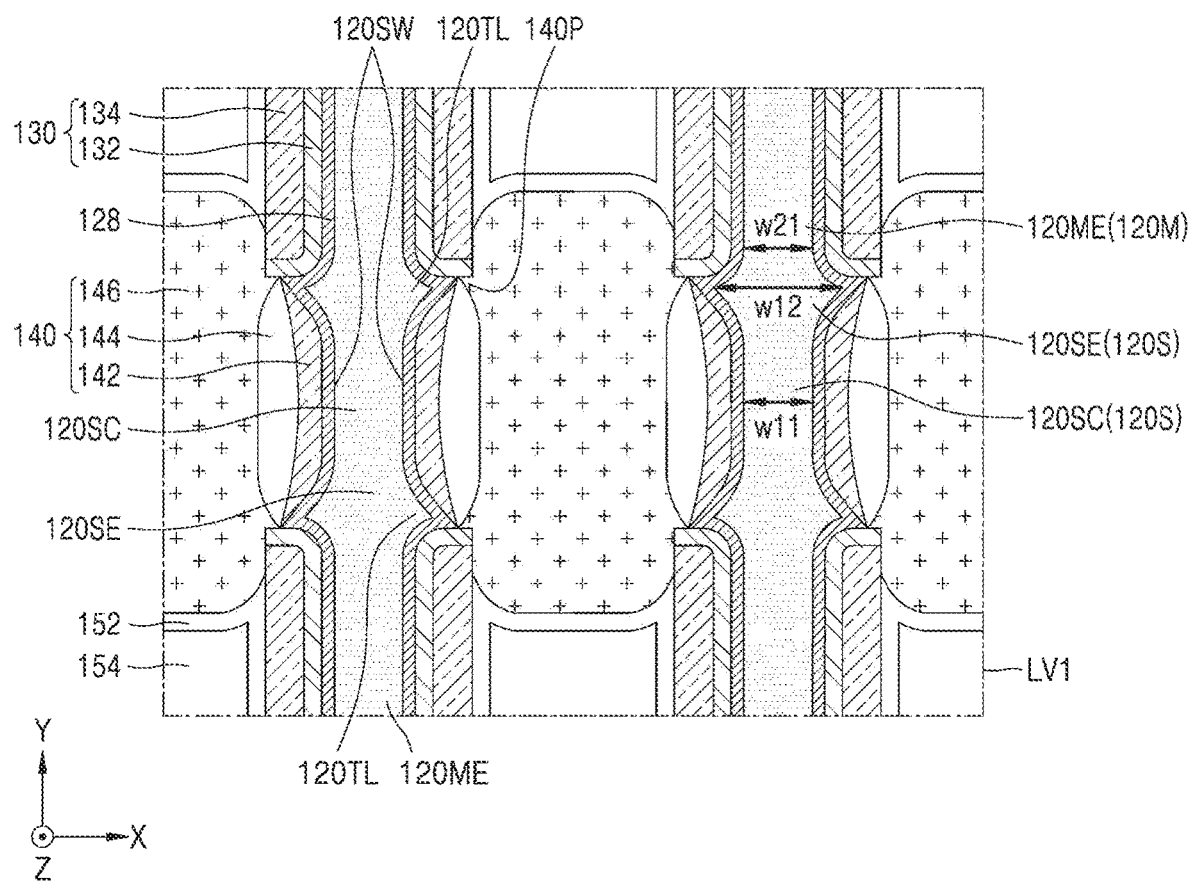
FIG. 5 is a horizontal cross-sectional view at a first vertical level LV1 of FIG. 4.
Figure 6:
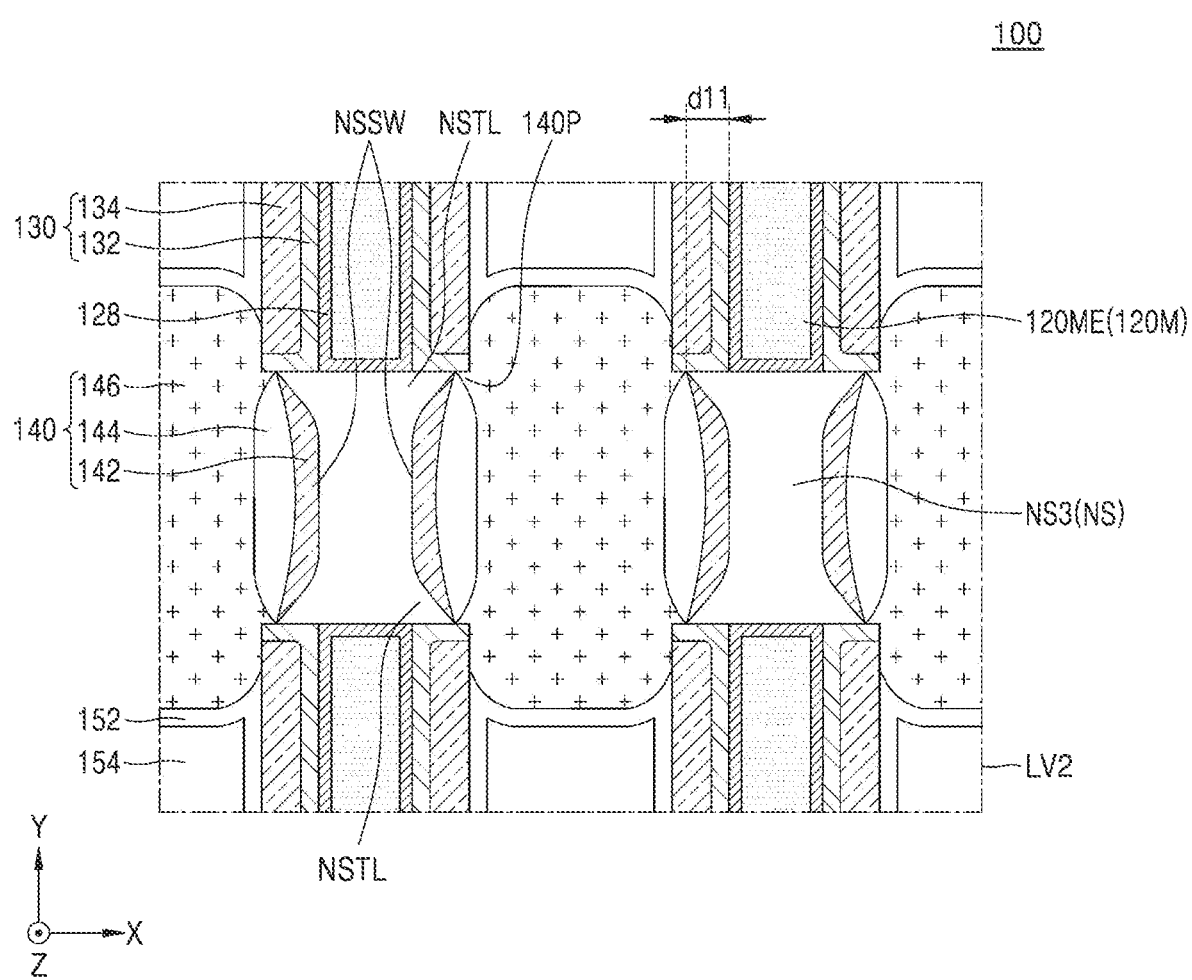
FIG. 6 is a horizontal cross-sectional view at a second vertical level LV2 of FIG. 4.

FIG. 1 is a layout illustrating an integrated circuit device 100 according to example embodiments. FIG. 2 is a cross-sectional view taken along line A1-A1' of FIG. 1, FIG. 3 is a cross-sectional view taken along line B1-B1' of FIG. 1, FIG. 4 is an enlarged view of a region CX1 of FIG. 2, FIG. 5 is a horizontal cross-sectional view at a first vertical level LV1 of FIG. 4, and FIG. 6 is a horizontal cross-sectional view at a second vertical level LV2 of FIG. 4.

Referring to FIGS. 1 to 6, a substrate 110 may include a fin-type active region FA provided in a device region DR. The fin-type active region FA may include a transistor TR, and for example, the transistor TR may be an NMOS transistor or a PMOS transistor. It will be understood that the fin-type active region FA may have a fin shape and thus may be referred to as a fin shaped active region.

The substrate 110 may include a semiconductor material such as silicon (Si) or germanium (Ge) or a compound semiconductor such as SiGe, SiC, GaAs, InAs, or InP. In some embodiments, the substrate 110 may include at least one of Group III-V materials and Group IV materials. The Group III-V materials may each be a binary, ternary, or quaternary compound including at least one Group III element and at least one Group V element. The Group III-V materials may each be a compound including at least one element of indium (In), gallium (Ga), and aluminum (Al) as Group III elements and at least one element of arsenic (As), phosphorus (P), and antimony (Sb) as Group V elements. For example, the Group III-V materials may be selected from among InP, $In_zGa_{1-z}As$ ($0 \leq z \leq 1$), and $Al_zGa_{1-z}As$ ($0 \leq z \leq 1$). The binary compound may be, for example, one of InP, GaAs, InAs, InSb, and GaSb. The ternary compound may be, for example, one of InGaP, InGaAs, AlInAs, InGaSb, GaAsSb, and GaAsP. The Group IV material may be Si or Ge. However, the Group III-V materials and the Group IV materials capable of being applied to the integrated circuit device according to example embodiments are not limited to the above-described examples.

In example embodiments, the Group III-V materials and the Group IV materials such as Ge may be used as a channel material for manufacturing a high speed transistor. A high performance complementary metal-insulator-semiconductor (CMOS) transistor may be formed by using a semiconductor substrate including a Group III-V material (for example, GaAs), which is higher in mobility of electrons than a Si substrate, and a semiconductor substrate including a semiconductor material (for example, Ge), which is higher in mobility of holes than the Si substrate. In some embodiments, in a case in which an NMOS transistor is formed on the substrate 110, the substrate 110 may include one of the above-described Group III-V materials. In some embodiments, in a case in which a PMOS transistor is formed on the substrate 110, at least a portion of the substrate 110 may include Ge. In some embodiments, the substrate 10 may have a semiconductor on insulator (SOI) structure such as a silicon on insulator. The substrate 110 may include a conductive region (for example, an impurity-doped well or an impurity-doped structure).

The fin-type active region FA may extend in a first direction (an X direction) on the substrate 110 and may protrude in a vertical direction (a Z direction) from an upper surface 110M of the substrate 110. In some embodiments, the fin-type active region FA may extend longitudinally in the first direction (the X direction) as illustrated in FIG. 1. An isolation trench 114T defining the fin-type active region FA may be provided in the substrate 110, and an isolation layer 114 may be disposed in the isolation trench 114T. In example embodiments, the isolation layer 114 may include an isolation liner (not shown) conformally provided on an inner wall of the isolation trench 114T and a gap fill insulation layer (not shown) filling an inner portion of the isolation trench 114T on the isolation liner. In FIG. 2, an upper surface of the isolation layer 114 is illustrated as an example as being disposed at the same level (e.g., at LV0 in FIG. 4) as an upper surface of the fin-type active region FA, but the inventive concept is not limited thereto. In some embodiments, the upper surface of the isolation layer 114 may be at a lower level than the upper surface of the fin-type active region FA, and only a lower portion of a sidewall of the fin-type active region FA may be surrounded by the isolation layer 114. The isolation liner and the gap fill insulation layer may each include silicon oxide, silicon nitride, or a combination thereof. In some embodiments, the first direction (the X direction) may be parallel to the upper surface 110M of the substrate 110 and may be perpendicular to the vertical direction (the Z direction).

A plurality of semiconductor patterns NS may be disposed apart from one another in the vertical direction (the Z direction) from an upper surface 110M of the substrate 110 in the fin-type active region FA. The plurality of semiconductor patterns NS may include the same material as that of the substrate 110. For example, the plurality of semiconductor patterns NS may include a semiconductor such as Si or Ge or a compound semiconductor such as SiGe, SiC, GaAs, InAs, or InP. Each of the plurality of semiconductor patterns NS may include a channel region.

The plurality of semiconductor patterns NS may include a first semiconductor pattern NS1, a second semiconductor pattern NS2, and a third semiconductor pattern NS3, which are arranged in this stated order from the upper surface 110M of the substrate 110. The plurality of semiconductor patterns NS may have a relatively large width in a second direction (a Y direction) and may have a relatively small thickness in the vertical direction (the Z direction), and each of the plurality of semiconductor patterns NS may have, for example, a nano-sheet shape. For example, the first semiconductor pattern NS1 may have a first thickness t11 of about 1 nm to about 10 nm in the vertical direction, the second semiconductor pattern NS2 may have a second thickness t12 of about 1 nm to about 10 nm in the vertical direction, and the third semiconductor pattern NS3 may have a third thickness t13 of about 1 nm to about 20 nm in the vertical direction. As illustrated in FIG. 3, the third thickness t13 of the third semiconductor pattern NS3 may be greater than the first thickness t11 of the first semiconductor pattern NS1 and the second thickness t12 of the second semiconductor pattern NS2, but the inventive concept is not limited thereto. In example embodiments, each of the plurality of semiconductor patterns NS may have a width of about 5 nm to about 100 nm in the first direction (the X direction) or the second direction (the Y direction), but the inventive concept is not limited thereto. In some embodiments, the second direction (the Y direction) may be parallel to the upper surface 110M of the substrate 110 and may be perpendicular to both the first direction (the X direction) and the vertical direction (the Z direction).

As illustrated in FIG. 2, the plurality of semiconductor patterns NS may be disposed apart from one another by the same distance (e.g., the same distance in the vertical direction). However, the inventive concept is not limited thereto, and a separation distance between two adjacent semiconductor patterns NS of the plurality of semiconductor patterns NS may vary. Moreover, the number of semiconductor patterns NS is not limited to the illustrations of FIGS. 2 to 4. In some embodiments, the number of semiconductor patterns NS may be two or more than three.

A gate electrode 120 may extend in the second direction (the Y direction) on the fin-type active region FA. The gate electrode 120 may extend on surfaces of the plurality of semiconductor patterns NS. In some embodiments, the gate electrode 120 may surround the plurality of semiconductor patterns NS and may extend on the fin-type active region FA and the isolation layer 114. In some embodiments, the gate electrode 120 may extend longitudinally in the second direction (the Y direction) as illustrated in FIG. 1.

The gate electrode 120 may include a main gate portion 120M and a plurality of sub-gate portions 120S. The main gate portion 120M may extend on (e.g., may cover) an upper surface of an uppermost semiconductor pattern NS (for example, the third semiconductor pattern NS3). The plurality of sub-gate portions 120S may be disposed between the fin-type active region FA and a lowermost semiconductor pattern NS (for example, the first semiconductor patterns NS1) and between two adjacent semiconductor patterns NS of the plurality of semiconductor patterns NS. For example, the plurality of sub-gate portions 120S may be disposed between the fin-type active region FA and the first semiconductor pattern NS1, between the first semiconductor pattern NS1 and the second semiconductor pattern NS2, and between the second semiconductor pattern NS2 and the third semiconductor pattern NS3. The main gate portion 120M may be disposed on an upper surface of the third semiconductor pattern NS3 and the isolation layer 114 and may be connected to the plurality of sub-gate portions 120S. Here, a portion of the main gate portion 120M disposed adjacent to the plurality of sub-gate portions 120S may be referred to as a main gate connection portion 120ME.

The gate electrode 120 may include a work function control conductive layer (not shown) and a buried conductive layer (not shown). In example embodiments, the work function control conductive layer may include aluminum (Al), copper (Cu), titanium (Ti), tantalum (Ta), tungsten (W), molybdenum (Mo), TaN, NiSi, CoSi, TiN, WN, TiAl, TiAlC, TiAlN, TaCN, TaC, TaSiN, or a combination thereof, but the inventive concept is not limited thereto. The buried conductive layer may include Al, Cu, Ti, Ta, W, Mo, TaN, NiSi, CoSi, TiN, WN, TiAl, TiAlC, TiAlN, TaCN, TaC, TaSiN, or a combination thereof, but the inventive concept is not limited thereto.

A gate insulation layer 128 may be disposed between the gate electrode 120 and the plurality of semiconductor patterns NS. The gate insulation layer 128 may be conformally disposed on an upper surface and a sidewall of each of the plurality of semiconductor patterns NS. In some embodiments, the gate insulation layer 128 may have a constant thickness along the upper surface and the sidewall of each of the plurality of semiconductor patterns NS as illustrated in FIGS. 3 and 4. The gate insulation layer 128 may be disposed on the upper surface of the fin-type active region FA and may extend onto the isolation layer 114.

In example embodiments, the gate insulation layer 128 may be provided in a stacked structure including an interface layer (not shown) and a high-k dielectric layer (not shown). The interface layer may cure an interfacial defect between the upper surface of the fin-type active region FA and a surface of each of the plurality of semiconductor patterns NS.

In some embodiments, the interface layer may include a dielectric material layer (for example, a low-k material layer, silicon oxide, silicon oxynitride, Ga oxide, Ge oxide, or a combination thereof) having a dielectric constant of about 9 or less. In some embodiments, the interface layer may include silicate, a combination of silicate and silicon oxide, or a combination of silicate and silicon oxynitride. In some embodiments, the interface layer may be omitted.

The high-k dielectric layer may include a material having a dielectric constant which is greater than that of silicon oxide (e.g., high-k dielectric material). For example, the high-k dielectric layer may have a dielectric constant of about 10 to about 25. The high-k dielectric layer may include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, and a combination thereof, but a material included in the high-k dielectric layer is not limited thereto. The high-k dielectric layer may be formed by an atomic layer deposition (ALD) process, a chemical vapor deposition (CVD) process, or a physical vapor deposition (PVD) process. The high-k dielectric layer may have a thickness of about 10 Å to about 40 Å, but the inventive concept is not limited thereto.

A spacer structure 130 may be disposed on each of both sidewalls of the gate electrode 120. The spacer structure 130 may include a first spacer 132 and a second spacer 134, which are sequentially disposed on a sidewall of the main gate portion 120M. As illustrated in FIG. 4, the first spacer 132 may be conformally disposed on the sidewall of the main gate portion 120M and on the third semiconductor pattern NS3 adjacent thereto. In some embodiments, the first spacer 132 may have a constant thickness on the sidewall of the main gate portion 120M and on the third semiconductor pattern NS3 as illustrated in FIG. 4. A bottom portion of the first spacer 132 may extend in a horizontal direction and may be disposed on an upper surface of the third semiconductor pattern NS3 and between the second spacer 134 and the third semiconductor pattern NS3. Each of the first and second spacers 132 and 134 may include silicon nitride or silicon oxynitride, but the inventive concept is not limited thereto.

A recess region RS1 may be provided in the fin-type active region FA on both sides of each of the plurality of semiconductor patterns NS (or next to both sides of each of the plurality of semiconductor patterns NS), and a source/drain region 140 may fill an inner portion of the recess region RS1. The source/drain region 140 may be connected to one end of each of the plurality of semiconductor patterns NS.

The source/drain region 140 may include a first semiconductor layer 142, a second semiconductor layer 144, and a third semiconductor layer 146 which are sequentially disposed on an inner wall of the recess region RS1. The first to third semiconductor layers 142, 144, and 146 may grow from the fin-type active region FA and the plurality of semiconductor patterns NS by, for example, a selective epitaxial growth (SEG) process. In some embodiments, the fin-type active region FA and the plurality of semiconductor patterns NS may be used as a seed layer for the selective epitaxial growth (SEG) process.

The first to third semiconductor layers 142, 144, and 146 may include at least one of an epitaxial-grown Si layer, an epitaxial-grown SiC layer, an epitaxial-grown SiGe layer, and an epitaxial-grown SiP layer. In example embodiments, the first to third semiconductor layers 142, 144, and 146 may each include a Si layer, and concentrations of impurities doped in the first to third semiconductor layers 142, 144, and 146 may differ. In some embodiments, the first to third semiconductor layers 142, 144, and 146 may each include a SiGe layer, and a content of Ge (a germanium concentration) in the first to third semiconductor layers 142, 144, and 146 may differ. In some embodiments, at least one of the first to third semiconductor layers 142, 144, and 146 may include a Si layer, and at least one other layer of the first to third semiconductor layers 142, 144, and 146 may include a SiGe layer. However, the inventive concept is not limited thereto. In some embodiments, at least one of the first to third semiconductor layers 142, 144, and 146 may be omitted. In some embodiments, at least one additional semiconductor layer may be further provided between two adjacent layers of the first to third semiconductor layers 142, 144, and 146.

As illustrated in FIGS. 2 and 4, in some embodiments, the recess region RS1 may have a width (e.g., a width in the X direction) that is greater in a center portion thereof than an uppermost portion thereof. Therefore, the source/drain region 140 that is in (e.g., fills) the recess region RS1 may have a width (e.g., a width in the X direction) that is greater in a center portion thereof than an uppermost portion thereof, and at least a portion of each of the plurality of semiconductor patterns NS contacting the source/drain region 140 may include an inclined sidewall.

As illustrated in FIG. 6, in a horizontal cross-sectional view at the second vertical level LV2, the source/drain region 140 may include a convex sidewall (e.g., a sidewall curved toward the third semiconductor pattern NS3), and the plurality of semiconductor patterns NS connected to the source/drain region 140 may include a concave sidewall NSSW conforming to a shape of the convex sidewall of the source/drain region 140. The plurality of semiconductor patterns NS may each include a tail portion NSTL which is disposed adjacent to the spacer structure 130 at both edge portions thereof in the first direction (the X direction). The tail portion NSTL may denote a portion of each of the plurality of semiconductor patterns NS disposed between an end portion of the concave sidewall NSSW and the spacer structure 130 or may denote a portion of each of the plurality of semiconductor patterns NS that are vertically overlapped (e.g., overlapped in the vertical direction) by the spacer structure 130. In a plan view, the tail portion NSTL may be overlapped by the spacer structure 130 in the second direction (the Y direction) and may protrude outwardly in the first direction (the X direction) beyond a sidewall of the main gate connection portion 120ME. For example, an edge of the tail portion NSTL may be disposed apart from a sidewall of the main gate connection portion 120ME in the first direction (the X direction). Each of the plurality of semiconductor patterns NS may include the tail portion NSTL, and thus, in a plan view, each of the plurality of semiconductor patterns NS may have a dumbbell shape. In some embodiments, the third semiconductor pattern NS3 may have a dumbbell shaped horizontal cross-sectional surface as illustrated in FIG. 6. It will be understand that each of the plurality of semiconductor patterns NS may have a dumbbell shaped horizontal cross-sectional surface. In some embodiments, the tail portion NSTL may be a taper portion and may have a wedge shape in a horizontal cross-sectional view as illustrated in FIG. 6.

It will be understood that "an element A overlapping an element B in a direction W" (or similar language) as used herein means that at least one line, which extends in the direction W and intersects both the elements A and B, exists. The term "dumbbell shape" as used herein may refer to a shape that is similar to the shape of the horizontal cross-sectional surface of the third semiconductor pattern NS3 as shown in FIG. 6. An element having a dumbbell shaped horizontal cross-sectional surface may include, in a horizontal cross-sectional view, opposing end portions having each a wider width and a middle portion having a narrower width that is narrower than the widths of the opposing end portions thereof, and in some embodiments, an element having a dumbbell shaped horizontal cross-sectional surface may include, a main portion having a constant width and opposing edge portions, each of which has a width that increases (e.g., monotonically increases) toward a corresponding end of the element as illustrated in FIG. 6.

As illustrated in FIG. 5, in some embodiments, in a horizontal cross-sectional view at the first vertical level LV1, the source/drain region 140 may include a convex sidewall (e.g., a sidewall curved toward the gate electrode 120), and a sub-gate portion 120S of the gate electrode 120 facing the source/drain region 140 may include a concave sidewall 120SW conforming to a shape of the convex sidewall of the source/drain region 140. The concave sidewall 120SW of the sub-gate portion 120S may be recessed inwardly (e.g., curved toward an inner portion of the sub-gate portion 120S). The sub-gate portion 120S may include a tail portion 120TL which is disposed adjacent to the spacer structure 130 at both edge portions thereof in the first direction (the X direction). The tail portion 120TL may denote a portion of each of the plurality of semiconductor patterns NS disposed between an end portion of the concave sidewall 120SW and the spacer structure 130 or may denote a portion of each of the plurality of semiconductor patterns NS which is vertically overlapped by the spacer structure 130. In a plan view, the tail portion 120TL may overlap the spacer structure 130 in the second direction (the Y direction). Since the sub-gate portion 120S includes the tail portion 120TL, the sub-gate portion 120S may have a dumbbell shape in a plan view. In some embodiments, the sub-gate portion 120S may have a dumbbell shaped horizontal cross-sectional surface as illustrated in FIG. 5. In some embodiments, the tail portion 120TL may be a taper portion and may have a wedge shape in a horizontal cross-sectional view as illustrated in FIG. 5.

The sub-gate portion 120S may include a sub-gate center portion 120SC and a sub-gate edge portion 120SE. The sub-gate center portion 120SC may denote a portion including a center point of the sub-gate portion 120S in the second direction (the Y direction), and the sub-gate edge portion 120SE may denote each of both end portions of the sub-gate portion 120S in the second direction (the Y direction). In some embodiments, the sub-gate edge portion 120SE may include the tail portion 120TL. As illustrated in FIG. 5, in some embodiments, since the sub-gate portion 120S has a dumbbell shape (e.g., a dumbbell shaped horizontal cross-sectional surface), a first width w11 of the sub-gate center portion 120SC may be less than a second width w12 of the sub-gate edge portion 120SE. The widest width of the sub-gate edge portion 120SE in the first direction (the X direction) is the second width w12. Also, a third width w21 of the main gate connection portion 120ME may be greater than the first width w11 of the sub-gate center portion 120SC and less than the second width w12 of the sub-gate edge portion 120SE. Each of the first width w11, the second width w12, and the third width w21 may be a width in the first direction (the X direction).

In some embodiments, in a horizontal cross-sectional view, the sub-gate center portion 120SC may have a constant width (e.g., the first width w11) in the first direction (the X direction) along the second direction (the Y direction), and the sub-gate edge portion 120SE may have a width in the first direction (the X direction), which increases (e.g., monotonically increases) toward the main gate connection portion 120ME, as illustrated in FIG. 5.

As illustrated in FIGS. 5 and 6, the source/drain region 140 may include a protrusion portion 140P which is adjacent to the tail portion 120TL of the sub-gate portion 120S and the tail portion NSTL of the semiconductor pattern NS. The protrusion portion 140P may face the concave sidewall 120SW of the sub-gate portion 120S and may protrude toward the concave sidewall 120SW. The tail portion NSTL of each of the semiconductor patterns NS may be disposed between the protrusion portion 140P of the source/drain region 140 and the main gate connection portion 120ME, and thus, a separation distance d11 between the protrusion portion 140P of the source/drain region 140 and the main gate connection portion 120ME may be relatively large. The tail portion NSTL of each of the semiconductor patterns NS may contribute to an increase of the separation distance d11 between the protrusion portion 140P of the source/drain region 140 and the main gate connection portion 120ME, and thus the separation distance d11 may decrease if the tail portion NSTL of each of the semiconductor patterns NS is omitted. For example, the separation distance d11 may be within a range of about 0.5 nm to about 20 nm, but the inventive concept is not limited thereto. According to some embodiments, since the separation distance d11 between the protrusion portion 140P of the source/drain region 140 and the main gate connection portion 120ME is relatively large, a leakage current between the source/drain region 140 and the main gate connection portion 120ME may be prevented or reduced. Moreover, a process error or defect such as an undesired connection between the dummy gate structure DG (e.g., DG in FIG. 18A) and the source/drain region 140 or an undesired connection between the gate electrode 120 and the source/drain region 140 may be prevented or reduced during a process of forming the source/drain region 140 or a process of removing a dummy gate structure DG (FIG. 18A) and/or during forming the gate electrode 120.

An insulation liner 152 and an inter-gate insulation layer 154 may be sequentially formed on both sidewalls of the spacer structure 130, the source/drain region 140, and the isolation layer 114. An upper insulation layer 162 may be disposed on the gate electrode 120 and the inter-gate insulation layer 154. A contact plug 166 may be disposed in a contact hole 166H which passes through the upper insulation layer 162 and exposes an upper surface of the source/drain region 140, and a metal silicide layer 168 may be further provided between the contact plug 166 and the source/drain region 140. For example, the metal silicide layer 168 may include titanium silicide or cobalt silicide, but the inventive concept is not limited thereto.

Although not shown, a wiring layer (not shown) and a via (not shown) connected to the contact plug 166 and the gate electrode 120 may be further provided.

Including the tail portion NSTL of the plurality of semiconductor patterns NS can be beneficial. The dummy gate structure DG (e.g., DG in FIG. 18A) may be formed on the plurality of semiconductor patterns NS, the recess region RS1 may be formed by removing a semiconductor pattern NS portion on both sides of the dummy gate structure DG, and the source/drain region 140 may be formed in the recess region RS1. After performing these processes, a separation distance between the recess region RS1 and the dummy gate structure DG may be relatively small at an edge portion of each semiconductor pattern NS and may cause a process error such as an undesired connection between the dummy gate structure DG and the source/drain region 140 or an undesired connection between the gate electrode 120 and the source/drain region 140. Moreover, since the separation distance between the recess region RS1 and the dummy gate structure DG is relatively small at the edge portion of each semiconductor pattern NS, a leakage current may occur between the gate electrode 120 and the source/drain region 140.

In contrast, according to example embodiments, since each of the plurality of semiconductor patterns NS has a dumbbell shape in a plan view (e.g., each of the plurality of semiconductor patterns NS has a dumbbell shaped horizontal cross-sectional surface), and the edge portion of each of the plurality of semiconductor patterns NS includes the tail portion NSTL, a relatively large separation distance may be secured between the dummy gate structure DG and the source/drain region 140 or between the gate electrode 120 and the source/drain region 140. Accordingly, a process error such as an undesired connection between the dummy gate structure DG and the source/drain region 140 or an undesired connection between the gate electrode 120 and the source/drain region 140 may be prevented or reduced. Also, a leakage current between the source/drain region 140 and the main gate connection portion 120ME may be prevented or reduced.

Figure 7:
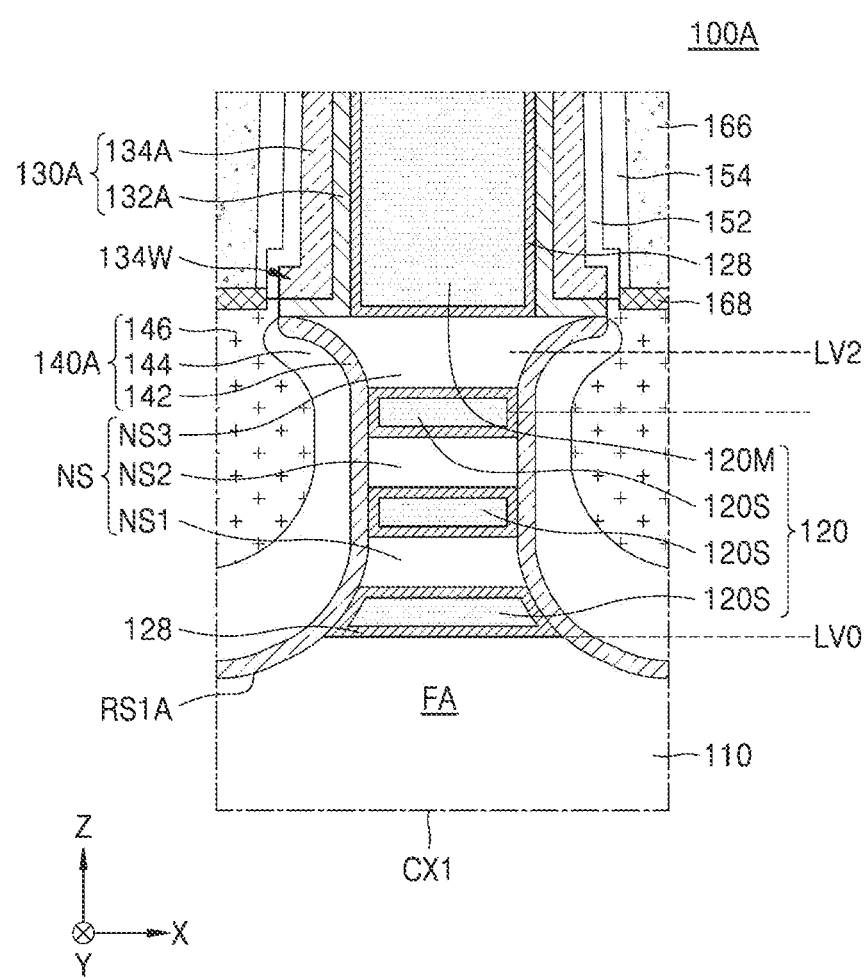
FIG. 7 is a cross-sectional view illustrating an integrated circuit device according to example embodiments.
Figure 8:
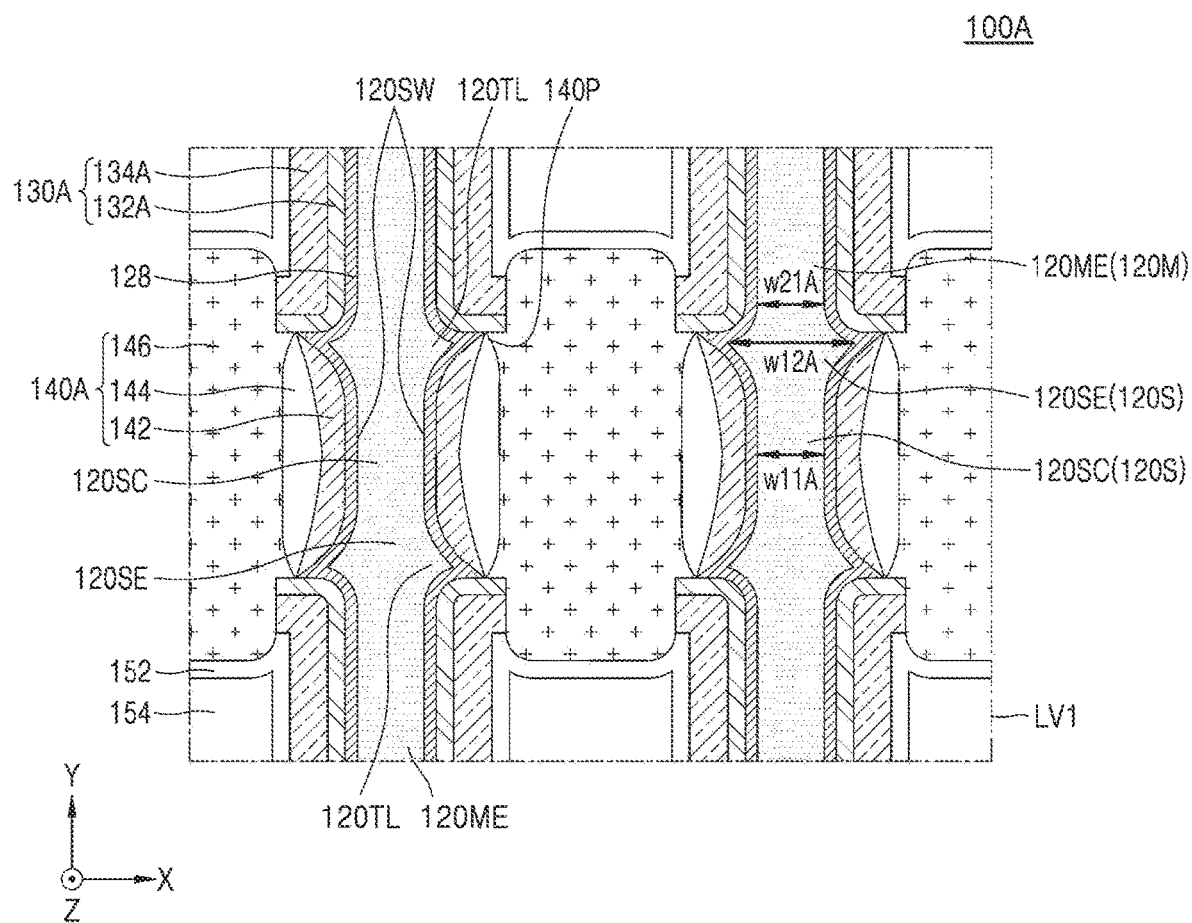
FIG. 8 is a horizontal cross-sectional view at a first vertical level LV1 of FIG. 7.

FIG. 7 is a cross-sectional view illustrating an integrated circuit device 100A according to example embodiments. FIG. 8 is a horizontal cross-sectional view at a first vertical level LV1 of FIG. 7, and FIG. 9 is a horizontal cross-sectional view at a second vertical level LV2 of FIG. 7.

Figure 9:
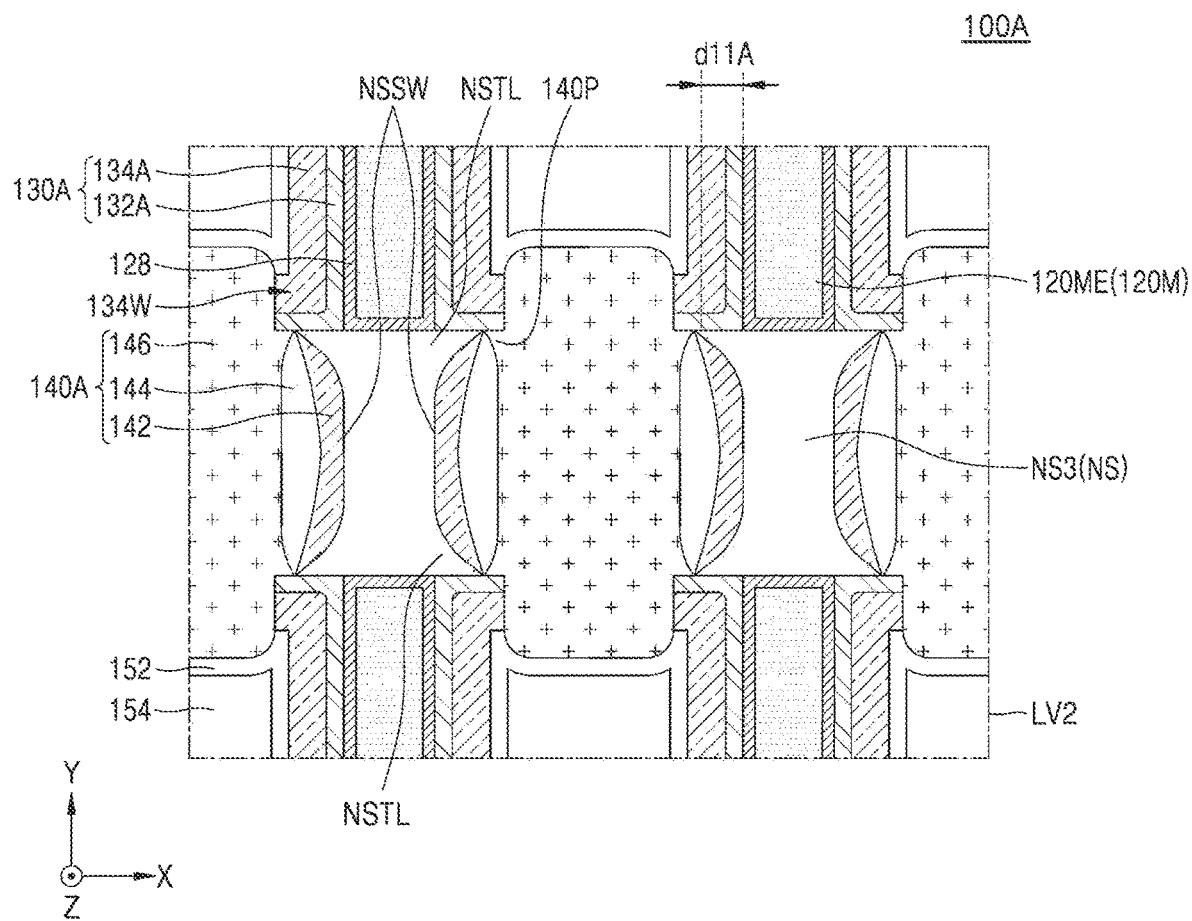
FIG. 9 is a horizontal cross-sectional view at a second vertical level LV2 of FIG. 7.

Referring to FIGS. 7 to 9, the spacer structure 130A may include a first spacer 132A and a second spacer 134A, which are sequentially disposed on a sidewall of a gate electrode 120, and a bottom portion of the first spacer 132A and a bottom portion of the second spacer 134A may extend in a horizontal direction on an upper surface of each of a plurality of semiconductor patterns NS. The second spacer 134A may include a lateral extension portion 134W, and the bottom portion of the first spacer 132A may be disposed between the lateral extension portion 134W and an uppermost semiconductor pattern NS (e.g., a third semiconductor pattern NS3). The lateral extension portion 134W may vertically overlap a protrusion portion 140P of a source/drain region 140A and a tail portion NSTL of each semiconductor pattern NS. Also, in a plan view, the lateral extension portion 134W may overlap a tail portion 120TL of a sub-gate portion 120S in the second direction (the Y direction).

The lateral extension portion 134W may be disposed on an upper surface of the uppermost semiconductor pattern NS, and thus, the upper surface of the uppermost semiconductor pattern NS may be covered by the spacer structure 130A during an etching process which is performed on each semiconductor pattern NS so as to form a recess region RS1A, whereby the uppermost semiconductor pattern NS may have a sidewall inclined at a relatively large angle. Also, a separation distance d11A between the protrusion portion 140P of the source/drain region 140A and a main gate connection portion 120ME may be relatively large.

As illustrated in FIG. 8, the sub-gate portion 120S may have a dumbbell shape, and thus, a first width w11A of a sub-gate center portion 120SC may be less than a second width w12A of a sub-gate edge portion 120SE. Also, a third width w21A of the main gate connection portion 120ME may be greater than the first width w11A of the sub-gate center portion 120SC and less than the second width w12A of the sub-gate edge portion 120SE.

For example, the separation distance d11A between the protrusion portion 140P of the source/drain region 140A and the main gate connection portion 120ME may be greater than the separation distance d11 between the protrusion portion 140P of the source/drain region 140 and the main gate connection portion 120ME in the integrated circuit device 100 described above with reference to FIGS. 1 to 6. Also, the second width w12A of the sub-gate edge portion 120SE may be greater than the second width w12 of the sub-gate edge portion 120SE in the integrated circuit device 100 described above with reference to FIGS. 1 to 6, but the inventive concept is not limited thereto.

According to a manufacturing process according to example embodiments, a first spacer layer 132L (see FIG. 21), a second spacer layer 134L (see FIG. 21), and a cover spacer layer 136LA (see FIG. 21) may be formed on a dummy gate structure DG (see FIG. 21), and the spacer structure 130A may be formed by performing an anisotropic etching process on the first spacer layer 132L, the second spacer layer 134L, and the cover spacer layer 136LA. When the cover spacer layer 136LA has a relatively large thickness, a portion of the second spacer layer 134L extending in a horizontal direction from a sidewall of the dummy gate structure DG on the plurality of semiconductor patterns NS may be relatively less etched by the cover spacer layer 136LA in the anisotropic etching process, and thus, the lateral extension portion 134W may remain.

In the integrated circuit device 100A according to the above-described embodiments, since the separation distance d11A between the protrusion portion 140P of the source/drain region 140A and the main gate connection portion 120ME is relatively large, a leakage current between the source/drain region 140A and the main gate connection portion 120ME may be prevented or reduced.

Figure 10:
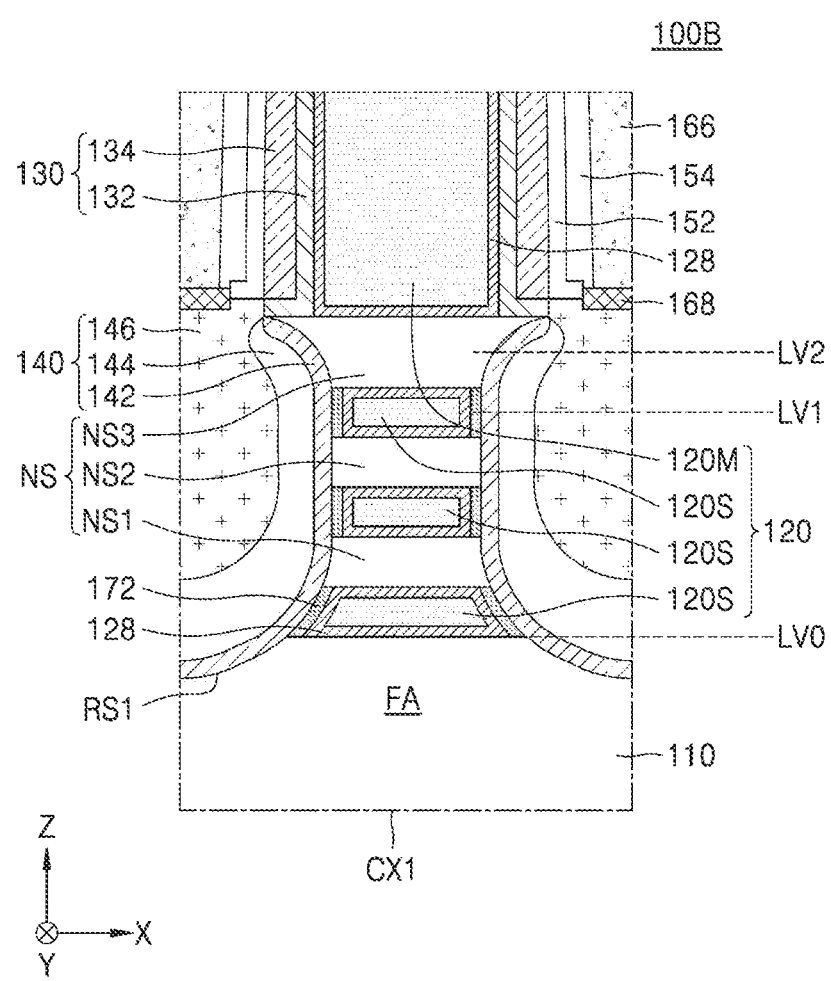
FIG. 10 is a cross-sectional view illustrating an integrated circuit device according to example embodiments.
Figure 11:
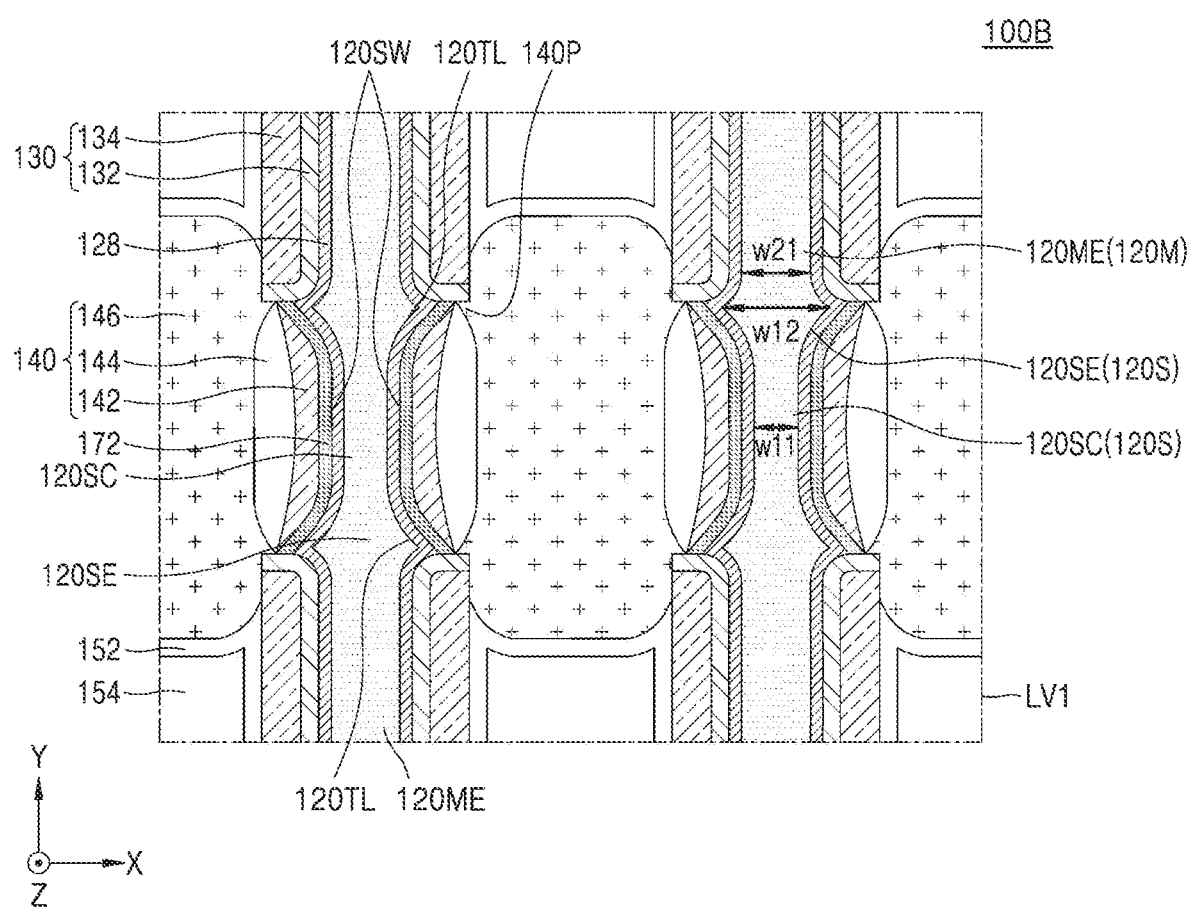
FIG. 11 is a horizontal cross-sectional view at a first vertical level LV1 of FIG. 10.

FIG. 10 is a cross-sectional view illustrating an integrated circuit device 100B according to example embodiments. FIG. 11 is a horizontal cross-sectional view at a first vertical level LV1 of FIG. 10, and FIG. 12 is a horizontal cross-sectional view at a second vertical level LV2 of FIG. 10.

Figure 12:
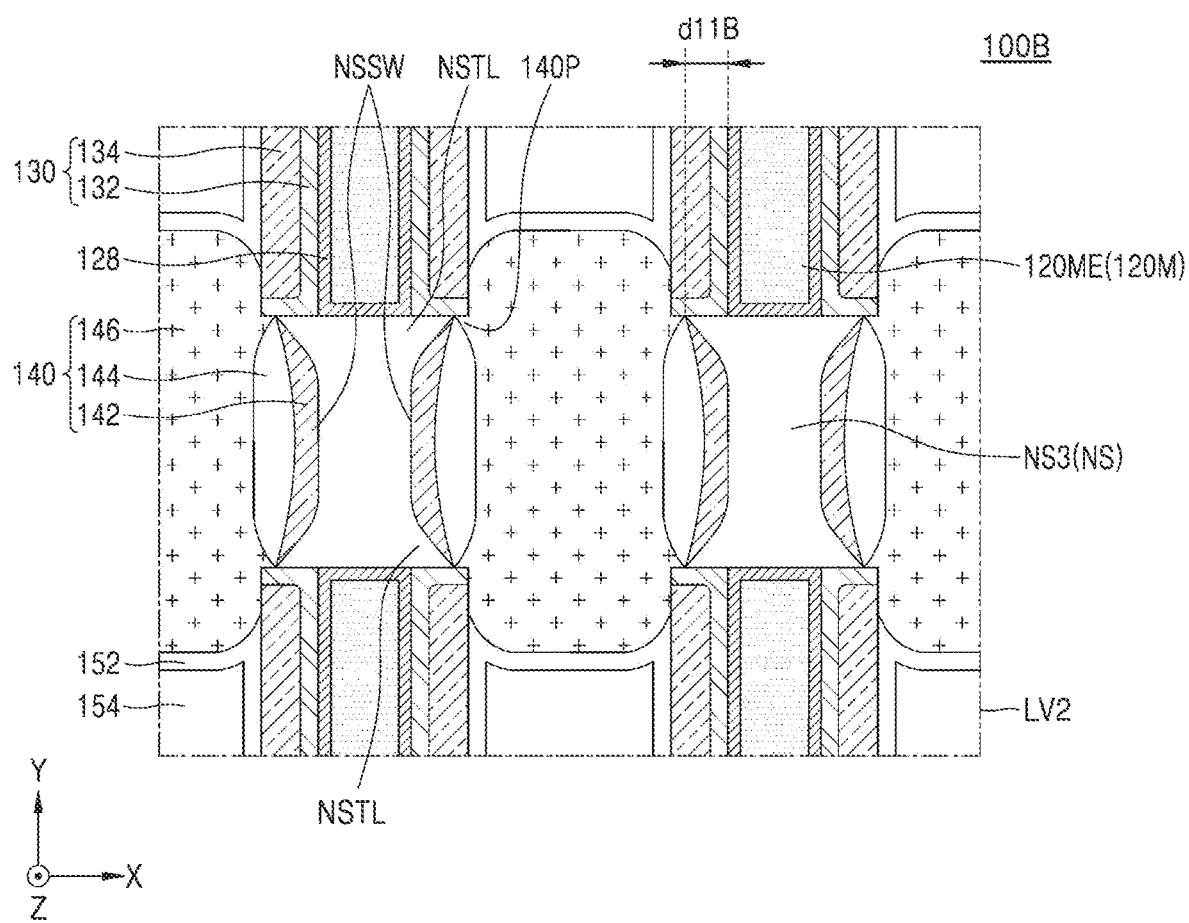
FIG. 12 is a horizontal cross-sectional view at a second vertical level LV2 of FIG. 10.

Referring to FIGS. 10 to 12, an inner spacer 172 may be disposed between a source/drain region 140 and a gate electrode 120. The inner spacer 172 may be disposed between a plurality of sub-gate portions 120S and the source/drain region 140, and a gate insulation layer 128 may be disposed between the inner spacer 172 and each of the plurality of sub-gate portions 120S. For example, the inner spacer 172 may include silicon nitride or silicon oxynitride.

As illustrated in FIG. 11, the inner spacer 172 may be conformally disposed on a concave sidewall 120SW of each of the plurality of sub-gate portions 120S. Also, a separation distance dl 1B between a protrusion portion 140P of the source/drain region 140 and a main gate connection portion 120ME may be relatively large, as illustrated in FIG. 12.

In the integrated circuit device 100B according to the above-described embodiments, since the separation distance d11B between the protrusion portion 140P of the source/drain region 140 and the main gate connection portion 120ME is relatively large, a leakage current between the source/drain region 140 and the main gate connection portion 120ME may be prevented or reduced.

FIGS. 13 to 20B are cross-sectional views illustrating a method of manufacturing an integrated circuit device according to some example embodiments. FIGS. 13, 14A, 15A, 16, 17A, 18A, 19A, and 20A are diagrams illustrating cross-sectional surfaces corresponding to a cross-sectional surface taken along line A1-A1' of FIG. 1, FIGS. 14B, 15B, 19B, and 20B are diagrams illustrating cross-sectional surfaces corresponding to cross-sectional surfaces taken along line B1-B1' of FIG. 1, and FIGS. 17B and 18B are diagrams illustrating horizontal cross-sectional surfaces at a first vertical level LV1 of FIG. 17A.

Figure 13:
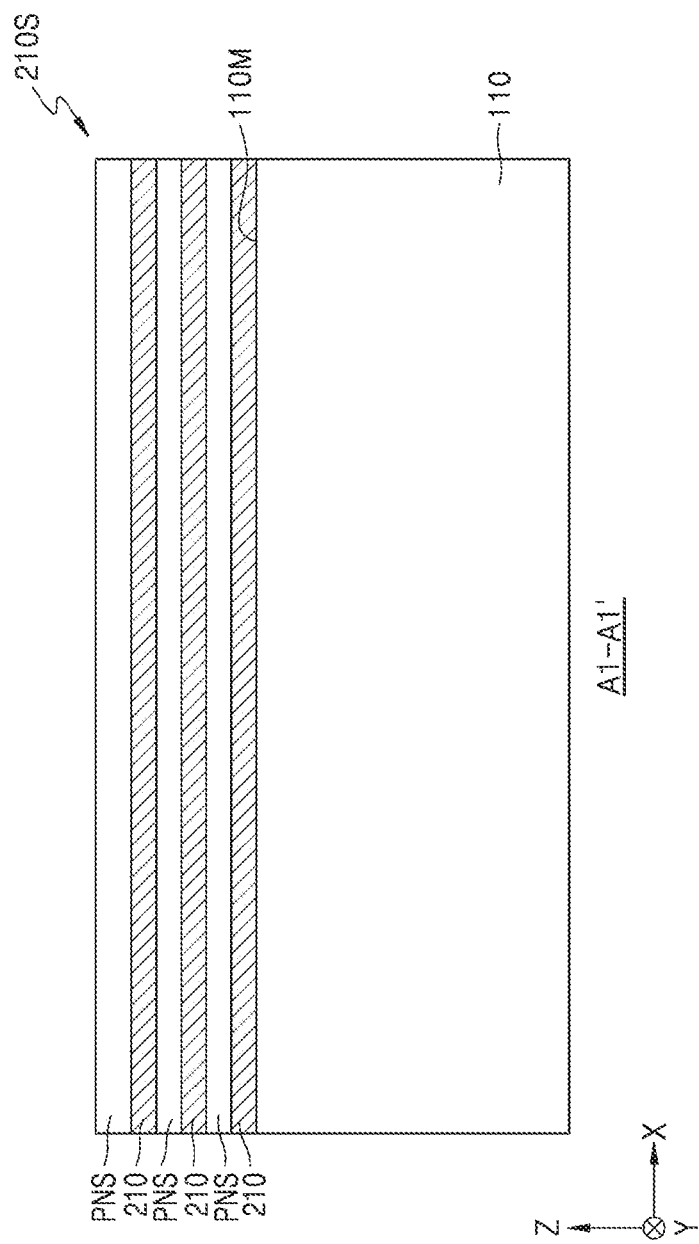

Referring to FIG. 13, a sacrificial layer 210 and a channel semiconductor layer PNS may be alternately and sequentially formed on an upper surface 110M of a substrate 110, thereby forming a sacrificial layer stack 210S. The sacrificial layer 210 and the channel semiconductor layer PNS may be formed by an epitaxy process.

In example embodiments, the sacrificial layer 210 and the channel semiconductor layer PNS may each include a material having etch selectivity with respect to each other. For example, each of the sacrificial layer 210 and the channel semiconductor layer PNS may include a single crystalline layer including a Group IV semiconductor and a Group IV-IV compound semiconductor or a Group III-V compound semiconductor, and the sacrificial layer 210 and the channel semiconductor layer PNS may include different materials. In some embodiments, the sacrificial layer 210 may include SiGe, and the channel semiconductor layer PNS may include crystalline silicon.

In example embodiments, the epitaxy process may be a molecular beam epitaxy process or a chemical vapor deposition (CVD) process such as a vapor-phase epitaxy (VPE) process or an ultra-high vacuum chemical vapor deposition (UHV-CVD) process, or a combination thereof. In the epitaxy process, a liquid or gaseous precursor may be used as a precursor needed for forming the sacrificial layer 210 and the channel semiconductor layer PNS.

Figure 14A:
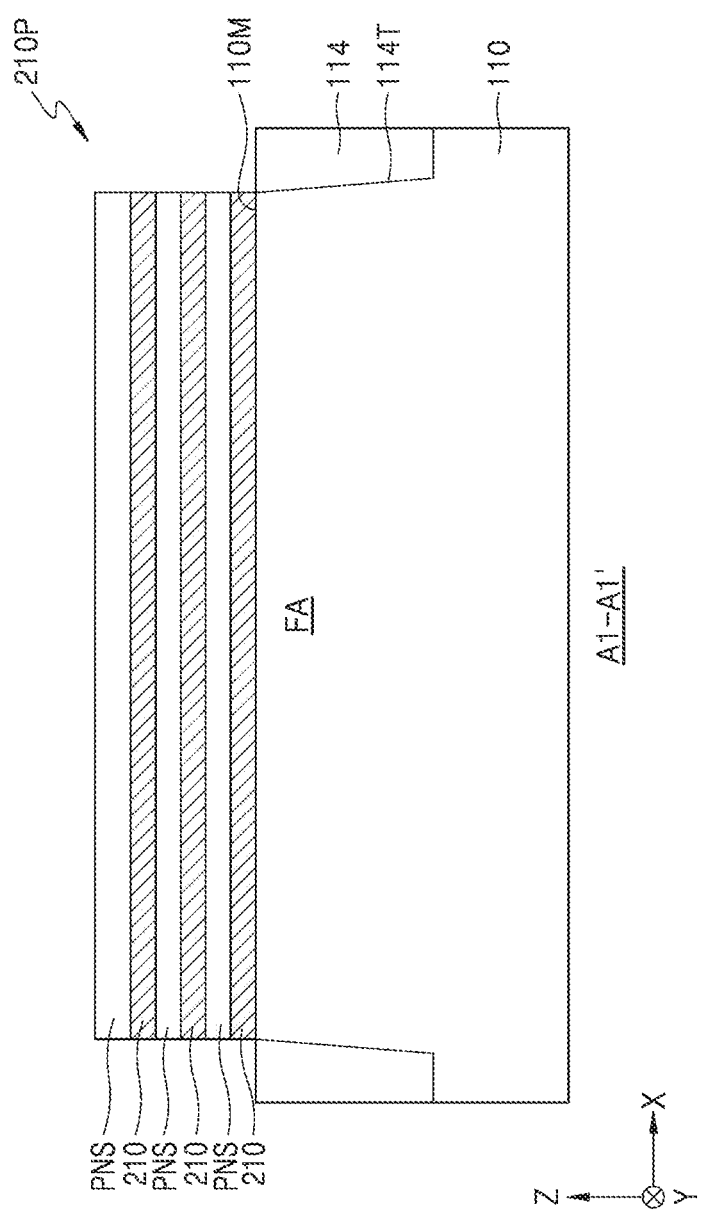
Figure 14B:
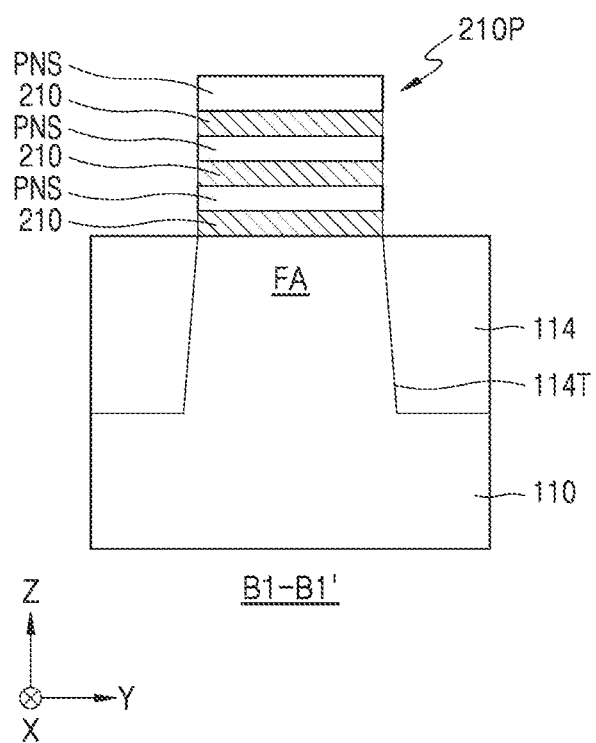

Referring to FIGS. 14A and 14B, a hard mask pattern (not shown) extending by a certain length in a first direction (an X direction) may be formed on the channel semiconductor layer PNS, and then, by using the hard mask pattern as an etch mask, a sacrificial layer pattern 210P and an isolation trench 114T may be formed by etching the sacrificial layers 210, the channel semiconductor layers PNS, and the substrate 110.

Subsequently, an insulating material may be filled into the isolation trench 114T, and then, an isolation layer 114 filling the isolation trench 114T may be formed by planarizing an upper portion of the insulating material. A fin-type active region FA may be defined in the substrate 110 by the isolation layer 114.

Subsequently, the hard mask pattern remaining on the sacrificial layer pattern 210P may be removed, and then, a recess process of removing a portion of the isolation layer 114 by a certain thickness from an upper surface thereof may be performed. In example embodiments, the recess process may be performed on the upper surface of the isolation layer 114 so that the upper surface of the isolation layer 114 is disposed at the same level as an upper surface 110M of the substrate 110. In some embodiments, a portion of a sidewall of the fin-type active region FA may be exposed by performing the recess process so that the upper surface of the isolation layer 114 is at a lower level than the upper surface 110M of the substrate 110.

Figure 15B:
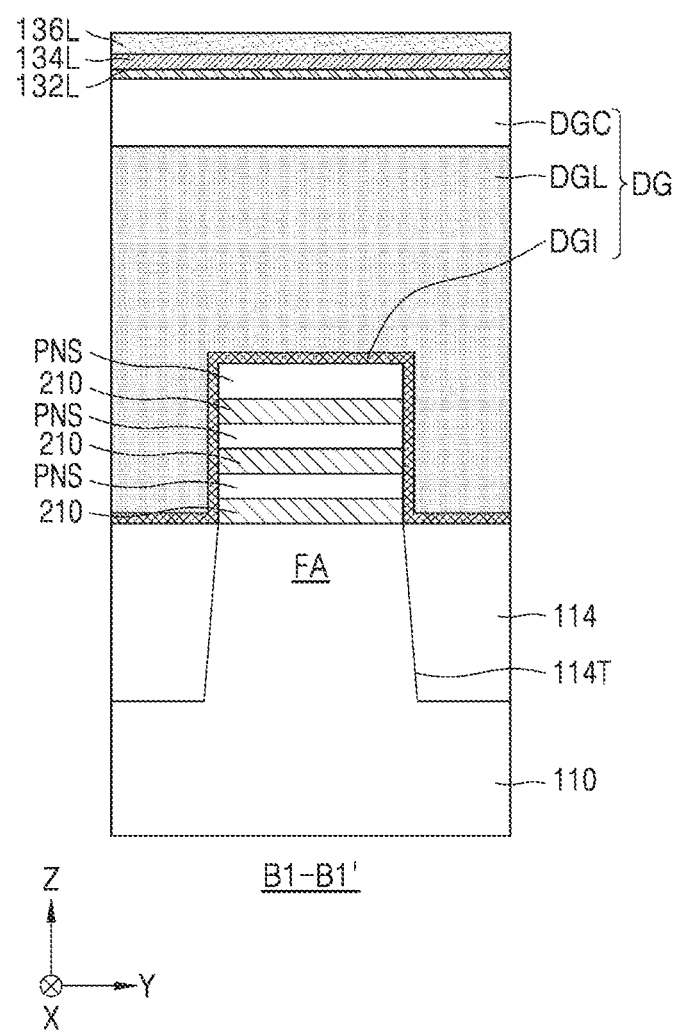

Referring to FIGS. 15A and 15B, a dummy gate structure DG may be formed on the sacrificial layer pattern 210P and the isolation layer 114. The dummy gate structure DG may include a dummy gate insulation layer DGI, a dummy gate line DGL, and a dummy gate capping layer DGC.

For example, the dummy gate line DGL may include polysilicon, and the dummy gate capping layer DGC may include silicon nitride. The dummy gate insulation layer DGI may include a material having etch selectivity with respect to the dummy gate line DGL, and for example, may include at least one material selected from among thermal oxide, silicon oxide, and silicon nitride.

Subsequently, a first spacer layer 132L, a second spacer layer 134L, and a cover spacer layer 136L may be sequentially formed on the dummy gate structure DG. For example, each of the first spacer layer 132L and the second spacer layer 134L may include silicon nitride or silicon oxynitride, and the cover spacer layer 136L may include silicon oxide. However, the inventive concept is not limited thereto.

Figure 16:
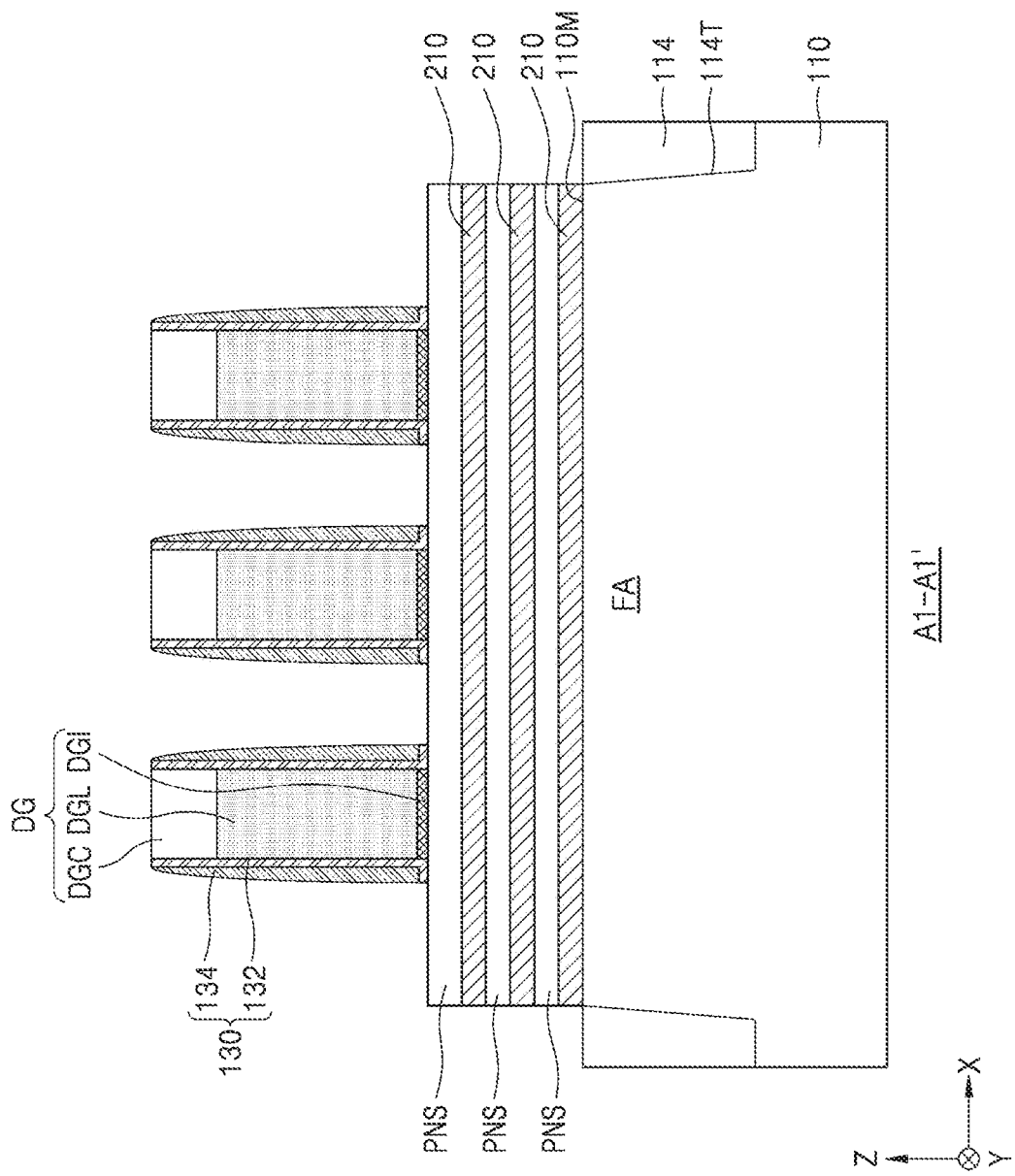

Referring to FIG. 16, a spacer structure 130 may be formed on each of both sides of the dummy gate structure DG by performing an anisotropic etching process on the first spacer layer 132L, the second spacer layer 134L, and the cover spacer layer 136L.

In the anisotropic etching process, the cover spacer layer 136L disposed on an upper surface of each of the dummy gate structure DG and the sacrificial layer pattern 210P may be removed together. The spacer structure 130 may include a first spacer 132 and a second spacer 134, which are sequentially disposed on a sidewall of the dummy gate structure DG, and a bottom surface of the second spacer 134 may be surrounded by the first spacer 132. In some embodiments, the bottom surface of the second spacer 134 may face the first spacer 132, and the first spacer 132 may extend between the bottom surface of the second spacer 134 and the sacrificial layer pattern 210P.

In FIG. 16, it is illustrated that the cover spacer layer 136L is completely removed and a sidewall of the second spacer 134 is not covered, but the inventive concept is not limited thereto. In some embodiments, a portion of the cover spacer layer 136L may remain on at least a portion of the sidewall of the second spacer 134. In this case, an additional etching process of removing the cover spacer layer 136L may be further performed. In some embodiments, the additional etching process of removing the cover spacer layer 136L may not be performed, and a remaining portion of the cover spacer layer 136L may be removed in a subsequent process of forming a recess region RS1 (e.g., RS1 in FIG. 17A).

Figure 17B:
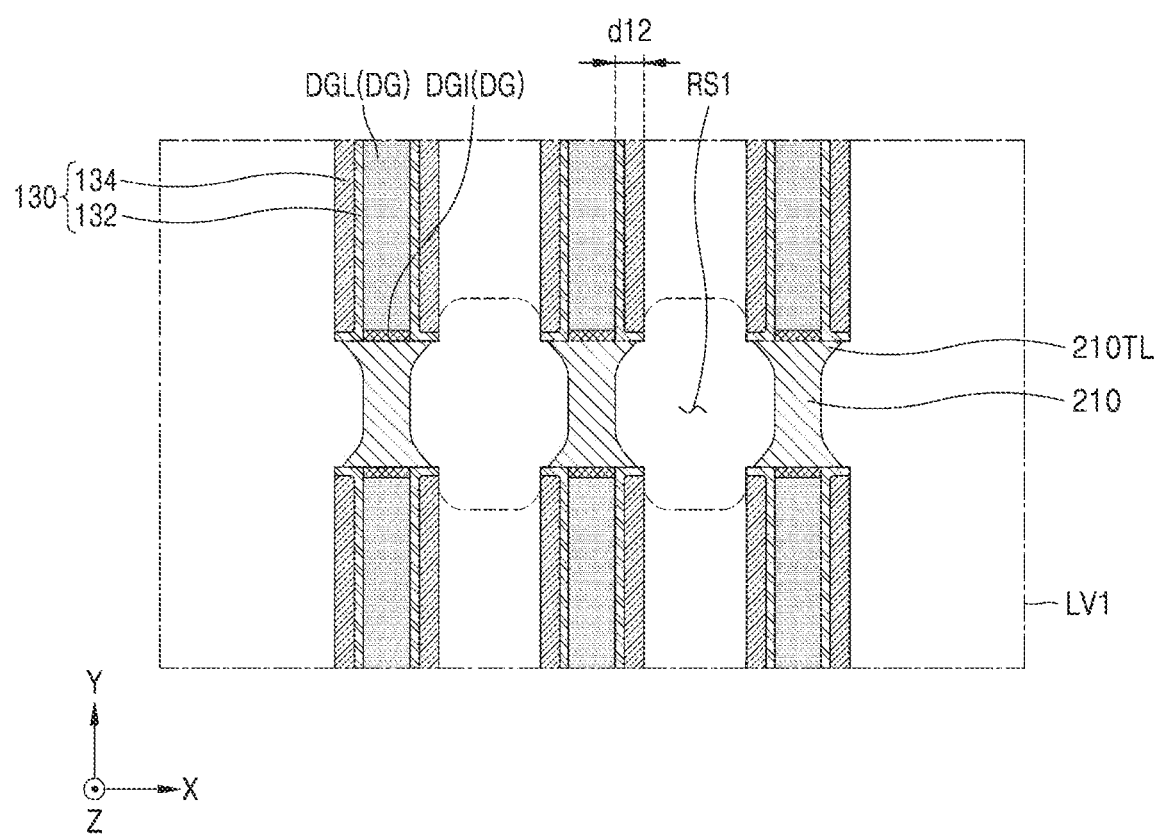

Referring to FIGS. 17A and 17B, the recess region RS1 may be formed at both sides of the dummy gate structure DG (or next to each of both sides of the dummy gate structure DG) by etching a portion of the substrate 110 and the sacrificial layer pattern 210P (see FIG. 16) at both sides of the spacer structure 130 and the dummy gate structure DG. As the recess region RS1 is formed, the sacrificial layer pattern 210P may be transformed to include a plurality of semiconductor patterns NS that are spaced apart from each other. For example, the plurality of semiconductor patterns NS may include first to third semiconductor patterns NS1 to NS3 that are spaced apart from one another by the sacrificial layer 210.

In example embodiments, in a process of forming the recess region RS1, a portion of an uppermost semiconductor pattern NS (e.g., the third semiconductor pattern NS3) vertically overlapped by the spacer structure 130 may not be removed, but the other semiconductor pattern NS (e.g., the second semiconductor pattern NS2 and/or the first semiconductor pattern NS1) vertically overlapped by the spacer structure 130 may be removed. A center width of the recess region RS1 may be greater than an upper width of the recess region RS1, and the plurality of semiconductor patterns NS and a plurality of sacrificial layers 210 may each include a tail portion 210TL disposed at a portion overlapping the spacer structure 130. As illustrated in FIG. 17B, as the tail portion 210TL of the sacrificial layer 210 is formed in a plan view, the sacrificial layer 210 may have a dumbbell shape. As illustrated in FIG. 17B, the recess region RS1 may have opposing sidewalls, each of which is curved outwardly. The recess region RS1 may have a center width in the first direction (the X direction) at or near a center thereof in a second direction (a Y direction), the recess region RS1 may have an edge width in the first direction (the X direction) adjacent to the dummy gate structure DG, and the center width may be greater than the edge width as illustrated in FIG. 17B.

As described above, an upper surface of the second spacer layer 134L may be covered by the cover spacer layer 136L in a process of forming the spacer structure 130, and thus, a width d12 of the spacer structure 130 remaining in the anisotropic etching process in the first direction (the X direction) may be relatively large. For example, when a width d12 of the spacer structure 130 in the first direction (the X direction) is relatively large, a portion of the sacrificial layer 210 adjacent to the spacer structure 130 may be less exposed to an etching atmosphere in a process of forming the recess region RS1, and thus, the tail portion 210TL of the sacrificial layer 210 may be formed.

Figure 18A:
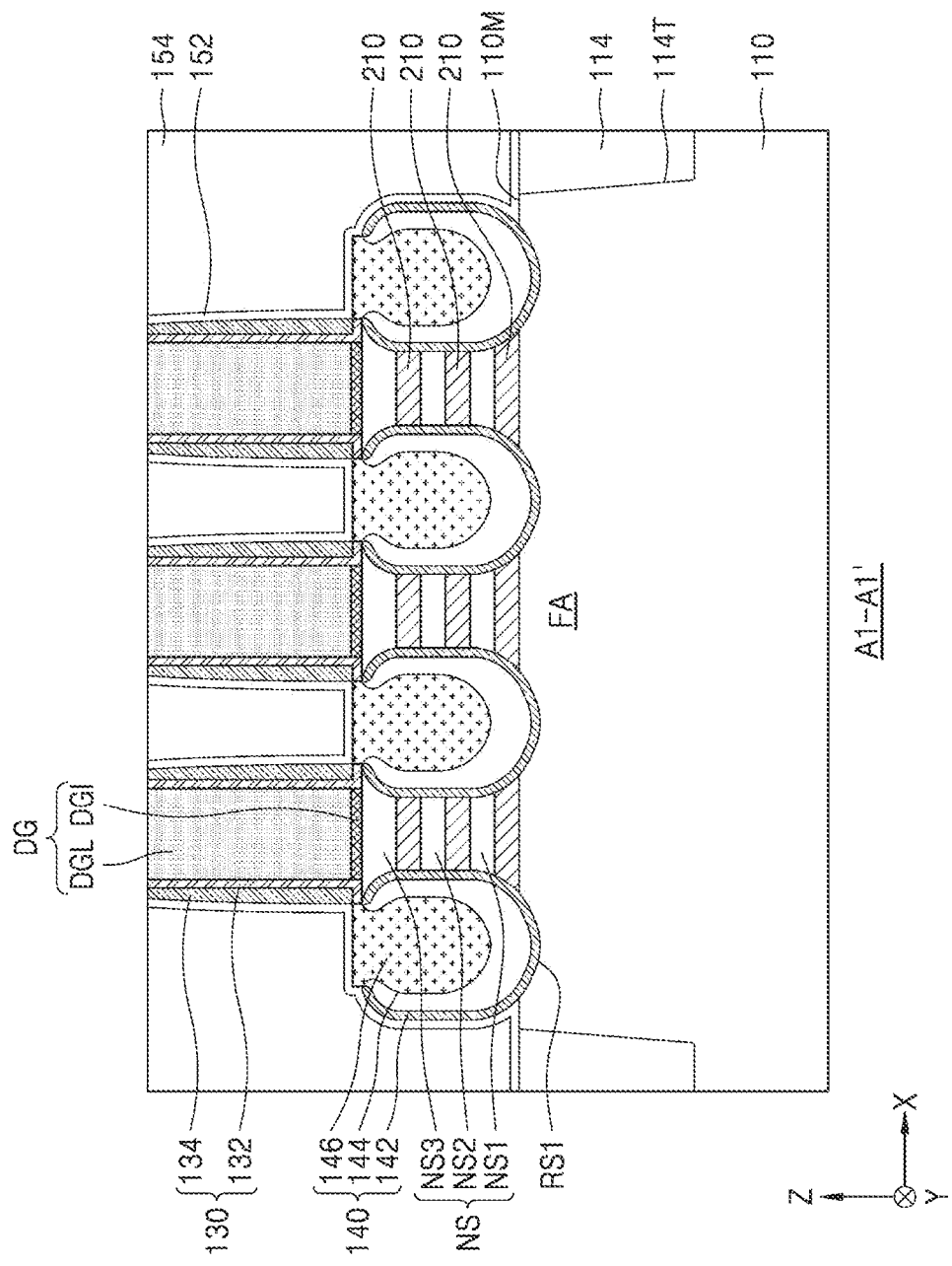
Figure 18B:
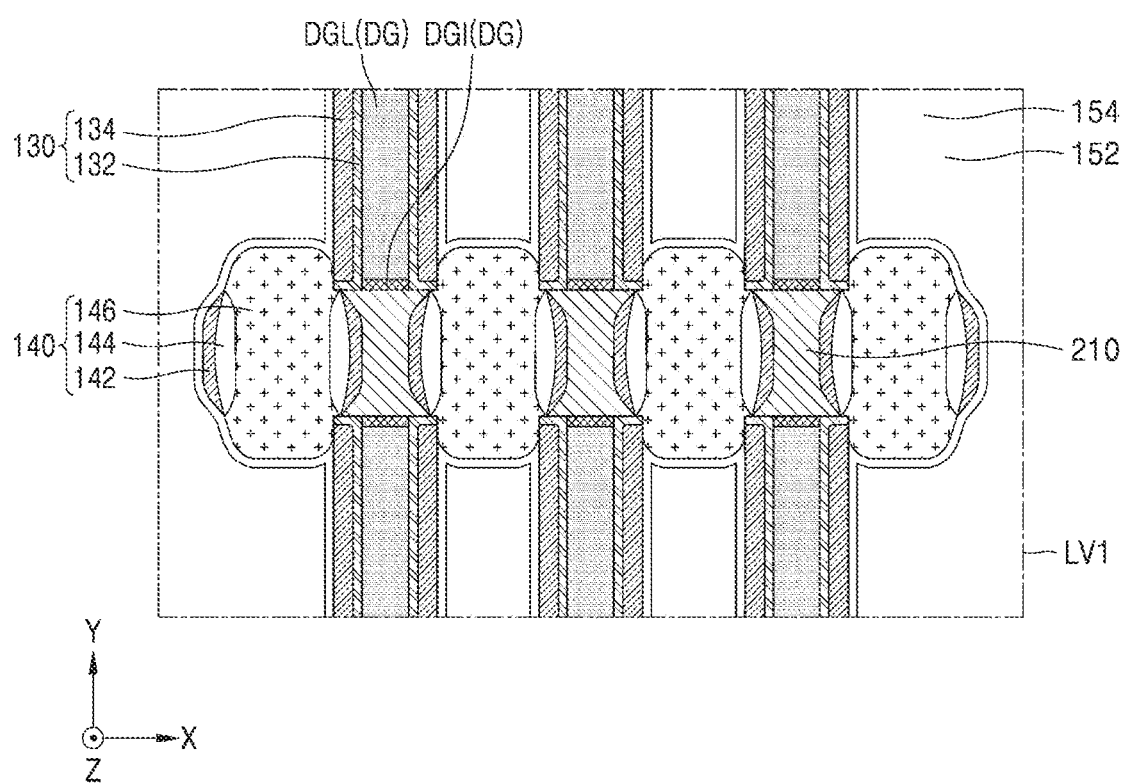

Referring to FIGS. 18A and 18B, a source/drain region 140 may be formed by sequentially forming a first semiconductor layer 142, a second semiconductor layer 144, and a third semiconductor layer 146 in the recess region RS1. For example, the first to third semiconductor layers 142, 144, and 146 may be formed by epitaxial-growing semiconductor materials from a surface of the substrate 110, the sacrificial layer 210, and the plurality of semiconductor patterns NS exposed at an inner wall of the recess region RS1. The first to third semiconductor layers 142, 144, and 146 may include at least one of an epitaxial-grown Si layer, an epitaxial-grown SiC layer, an epitaxial-grown SiGe layer, and an epitaxial-grown SiP layer.

Subsequently, a gate insulation liner 152 and an inter-gate insulation layer 154 may be sequentially formed on a sidewall of the spacer structure 130 and the source/drain region 140. By planarizing an upper portion of each of the dummy gate structure DG, the gate insulation liner 152, and the inter-gate insulation layer 154, a dummy gate capping layer DGC (see FIG. 17A) of the dummy gate structure DG may be removed and an upper surface of a dummy gate line DGL may be exposed.

Figure 19A:
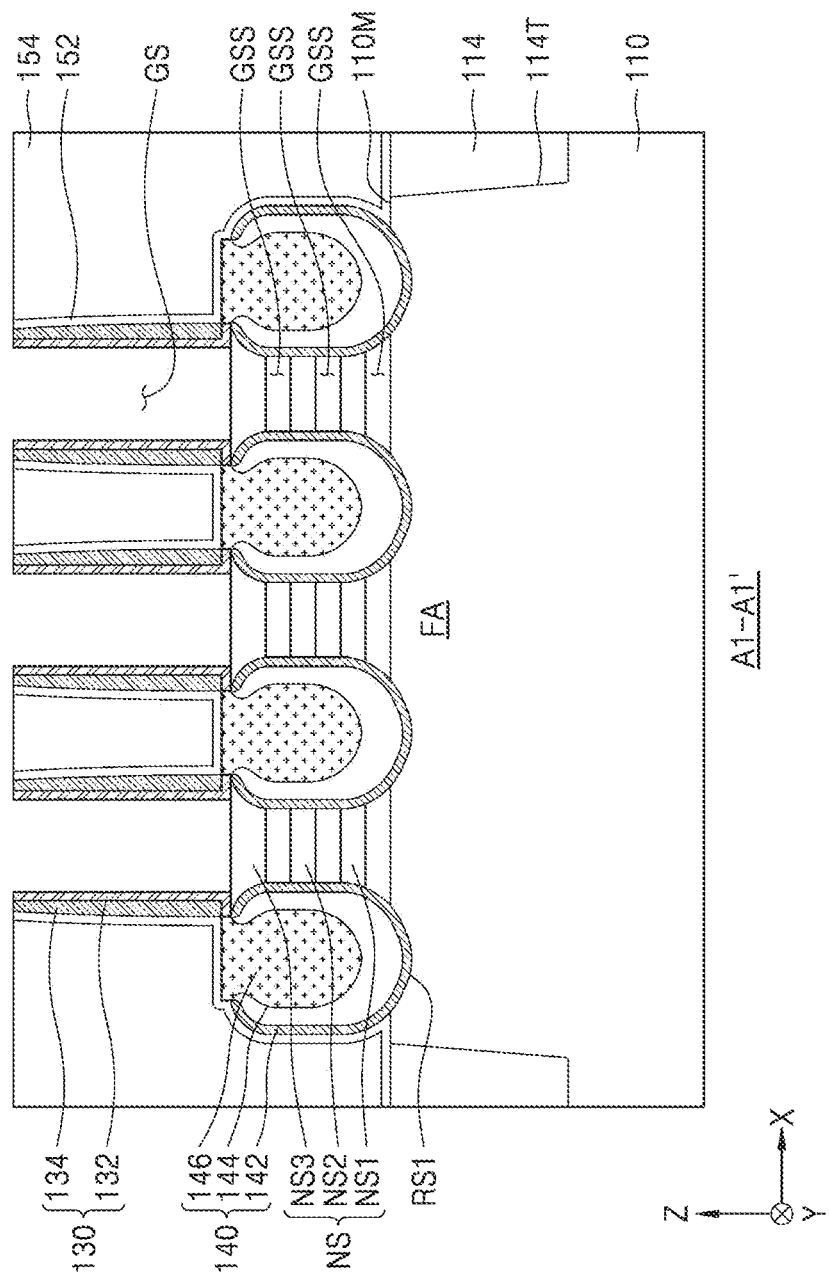
Figure 19B:
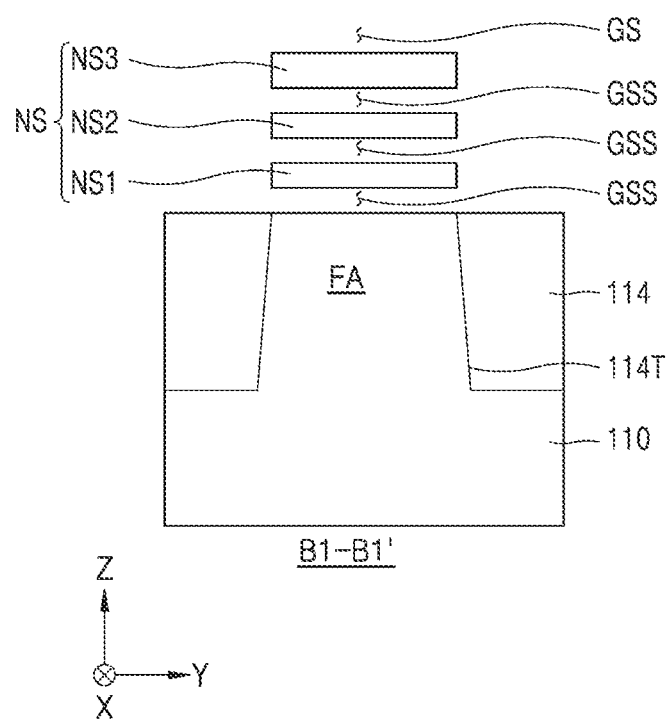

Referring to FIGS. 19A and 19B, a gate space GS may be formed by removing the dummy gate line DGL and the dummy gate insulation layer DGI, each of which is exposed by the inter-gate insulation layer 154.

Subsequently, a portion of an upper surface of each of the plurality of semiconductor patterns NS and a portion of an upper surface of the fin-type active region FA may be exposed by removing, through the gate space GS, a plurality of sacrificial layers 210 remaining on the fin-type active region FA. A sub-gate space GSS may be formed between adjacent semiconductor patterns NS of the plurality of semiconductor patterns NS and between a lowermost semiconductor pattern NS and the fin-type active region FA. A process of removing the plurality of sacrificial layers 210 may be, for example, a wet etching process using an etch selectivity between the sacrificial layer 210 and each of the plurality of semiconductor patterns NS.

Moreover, the plurality of sacrificial layers 210 and the plurality of semiconductor patterns NS may each have a dumbbell shape in a plan view, and thus, an upper surface of the source/drain region 140 may not be exposed to the gate space GS in a process of removing the dummy gate line DGL. For example, when a separation distance between the source/drain region 140 and the dummy gate line DGL is relatively small, an edge portion of the source/drain region 140 may also be exposed to the etching atmosphere in the process of removing the dummy gate line DGL, and an error where the source/drain region 140 is removed or a gate electrode material is filled into a removed portion may occur. However, since the plurality of sacrificial layers 210 and the plurality of semiconductor patterns NS have a dumbbell shape in a plan view, an error may be reduced or possibly prevented from occurring in the process of removing the dummy gate line DGL.

Figure 20A:
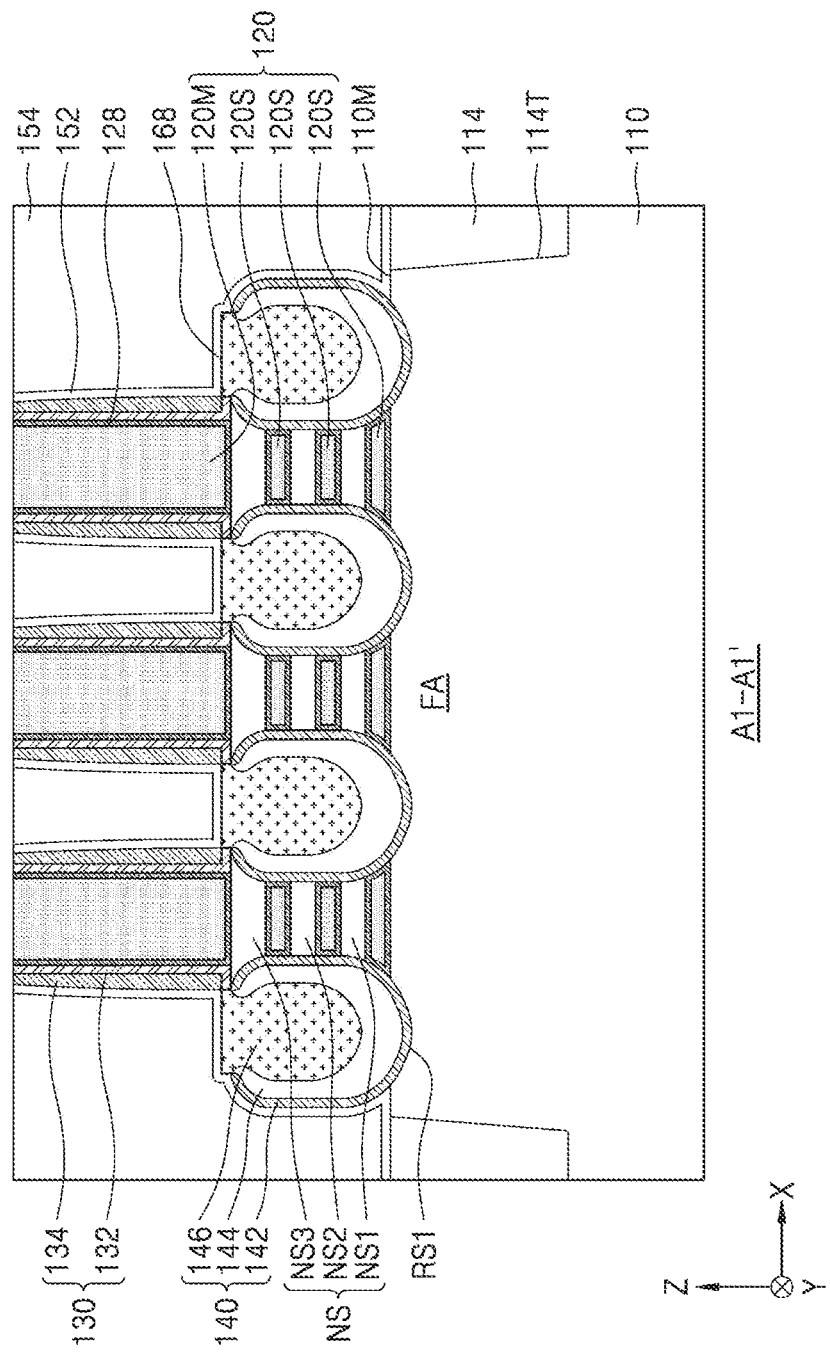
Figure 20B:
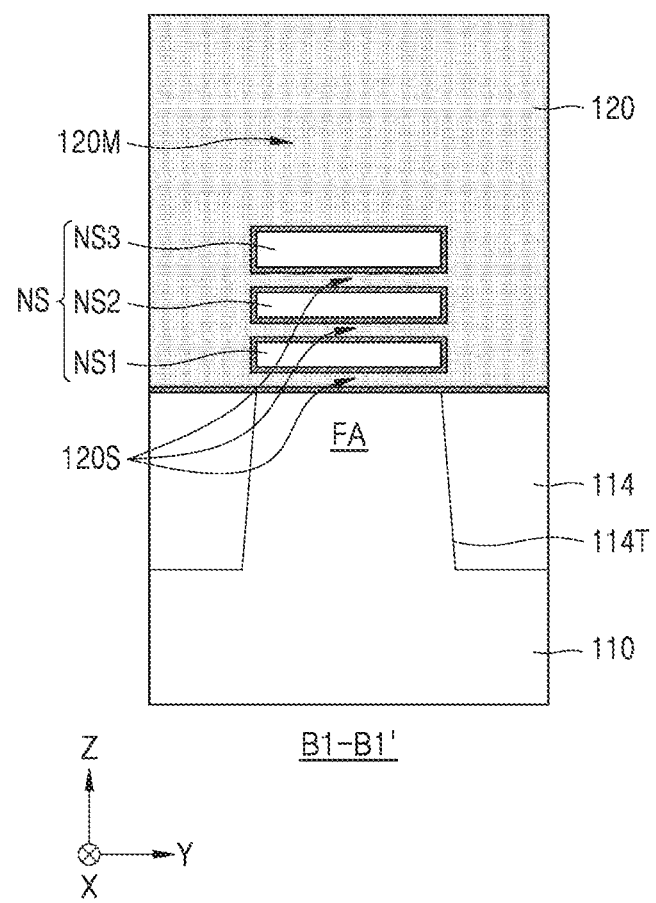

Referring to FIGS. 20A and 20B, a gate insulation layer 128 may be formed on each of surfaces exposed to the gate space GS and the sub-gate space GSS. Subsequently, a gate electrode 120 filling the gate space GS and the sub-gate space GSS may be formed on the gate insulation layer 128. For example, a work function control conductive layer (not shown) may be conformally formed on an inner wall of each of the gate space GS and the sub-gate space GSS, and then, a buried conductive layer (not shown) may be formed on the work function control conductive layer to fill the gate space GS and the sub-gate space GSS. Subsequently, the gate electrode 120 may be formed by planarizing an upper portion of the buried conductive layer so that an upper surface of the inter-gate insulation layer 154 is exposed. In example embodiments, the work function control conductive layer may include Al, Cu, Ti, Ta, W, Mo, TaN, NiSi, CoSi, TiN, WN, TiAl, TiAlC, TiAlN, TaCN, TaC, TaSiN, or a combination thereof. The buried conductive layer may include Al, Cu, Ti, Ta, W, Mo, TaN, NiSi, CoSi, TiN, WN, TiAl, TiAlC, TiAlN, TaCN, TaC, TaSiN, or a combination thereof.

Referring again to FIGS. 2 through 4, an upper insulation layer 162 may be formed, a contact hole 166H passing through the upper insulation layer 162 may be formed subsequently, and a contact plug 166 may be formed by filling the contact hole 166H with a conductive material subsequently.

According to the above-described method of manufacturing the integrated circuit device 100, an upper surface of the second spacer layer 134L may be covered by the cover spacer layer 136L in a process of forming the spacer structure 130, and thus, a width d12 of the spacer structure 130 in the first direction (the X direction) may be relatively large. Therefore, the plurality of semiconductor patterns NS may be formed to have a dumbbell shape in a plan view in a process of forming the recess region RS1, and in a subsequent process of removing the dummy gate line DGL, an upper surface of the source/drain region 140 may not be exposed to the gate space GS. The occurrence of an error such as the exposure and removal of the source/drain region 140 may be reduced or possibly prevented in the above-described process of removing the dummy gate line DGL.

Figure 22A:
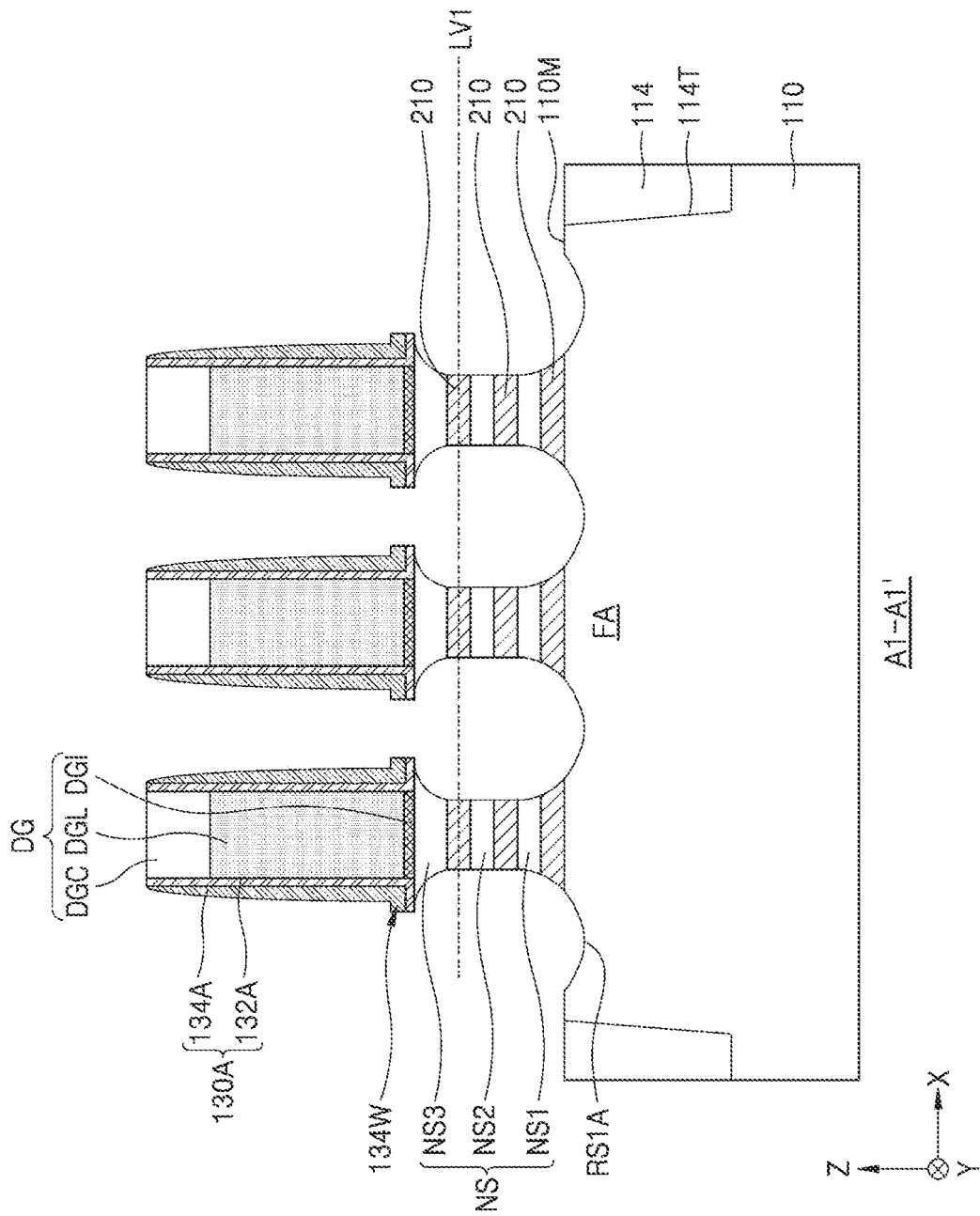
Figure 22B:
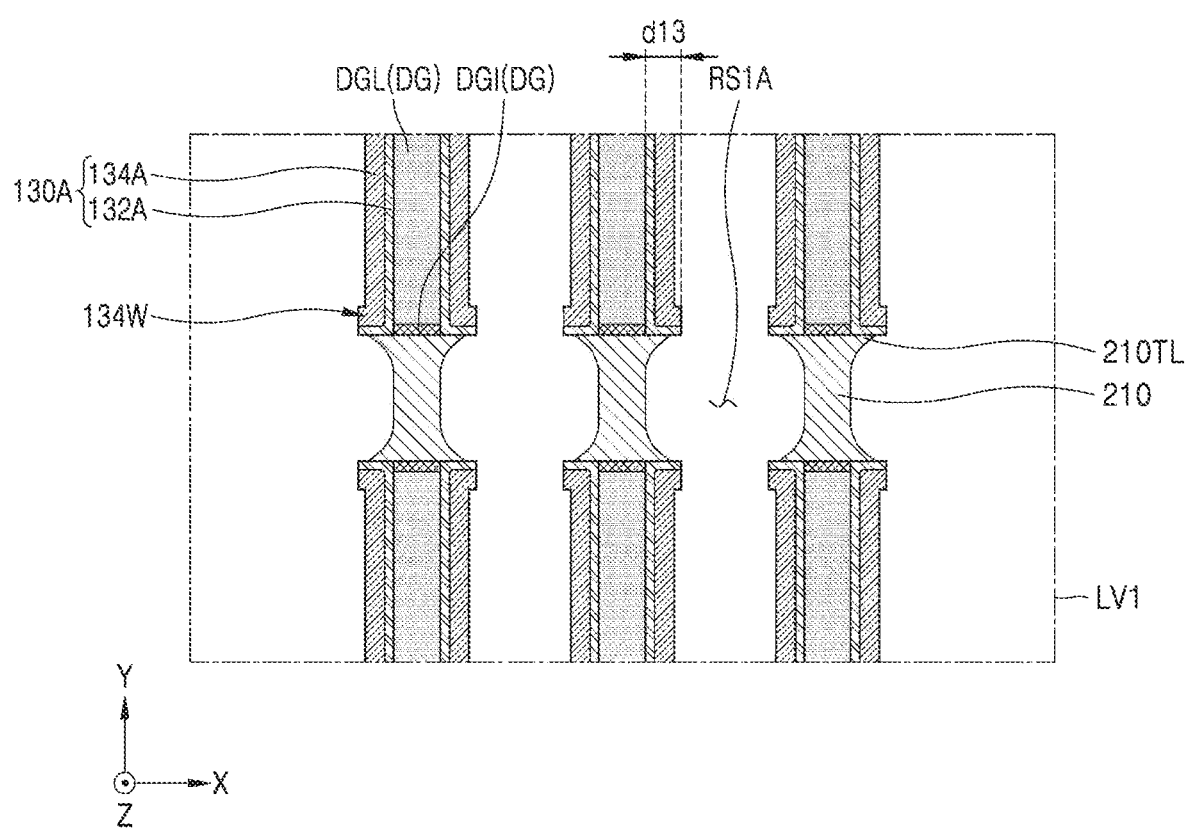

FIGS. 21 to 22B are schematic diagrams illustrating a method of manufacturing an integrated circuit device 100A, according to example embodiments.

Referring to FIG. 21, a first spacer layer 132L, a second spacer layer 134L, and a cover spacer layer 136LA may be sequentially formed on an upper surface and a sidewall of the dummy gate structure DG. A thickness of the cover spacer layer 136LA may be relatively large.

Referring to FIGS. 22A and 22B, a spacer structure 130A may be formed by performing an anisotropic etching process on the first spacer layer 132L, the second spacer layer 134L, and the cover spacer layer 136LA. A second spacer 134A may be formed to include a lateral extension portion 134W extending in a horizontal direction in the anisotropic etching process.

In FIG. 22A, it is illustrated that the cover spacer layer 136LA is completely removed and a sidewall of the second spacer 134A is not covered, but the inventive concept is not limited thereto. In some embodiments, a portion of the cover spacer layer 136LA may remain on at least a portion of the sidewall of the second spacer 134A. In this case, an additional etching process of removing the cover spacer layer 136LA may be further performed. In some embodiments, the additional etching process of removing the cover spacer layer 136LA may not be performed, and a remaining portion of the cover spacer layer 136LA may be removed in a subsequent process of forming a recess region RS1A.

Subsequently, the recess region RS1A may be formed next to (e.g., adjacent to) each of both sides of the dummy gate structure DG by etching a portion of the substrate 110 and the sacrificial layer pattern 210P next to each of both sides of the spacer structure 130 and the dummy gate structure DG.

As described above, an upper surface of the second spacer layer 134L may be covered by the cover spacer layer 136LA in a process of forming the spacer structure 130A, and thus, a width d13 of the spacer structure 130A remaining in the anisotropic etching process in a first direction (an X direction) may be relatively large. For example, when the width d13 of the spacer structure 130A in the first direction (the X direction) is relatively large, a portion of a sacrificial layer 210 adjacent to the spacer structure 130A may be less exposed to an etching atmosphere in a process of forming the recess region RS1A, and thus, a tail portion 210TL of the sacrificial layer 210 may be formed.

Subsequently, the integrated circuit device 100A may be formed by performing processes similar to the processes described above with reference to FIGS. 18A to 20B.

Figure 24:
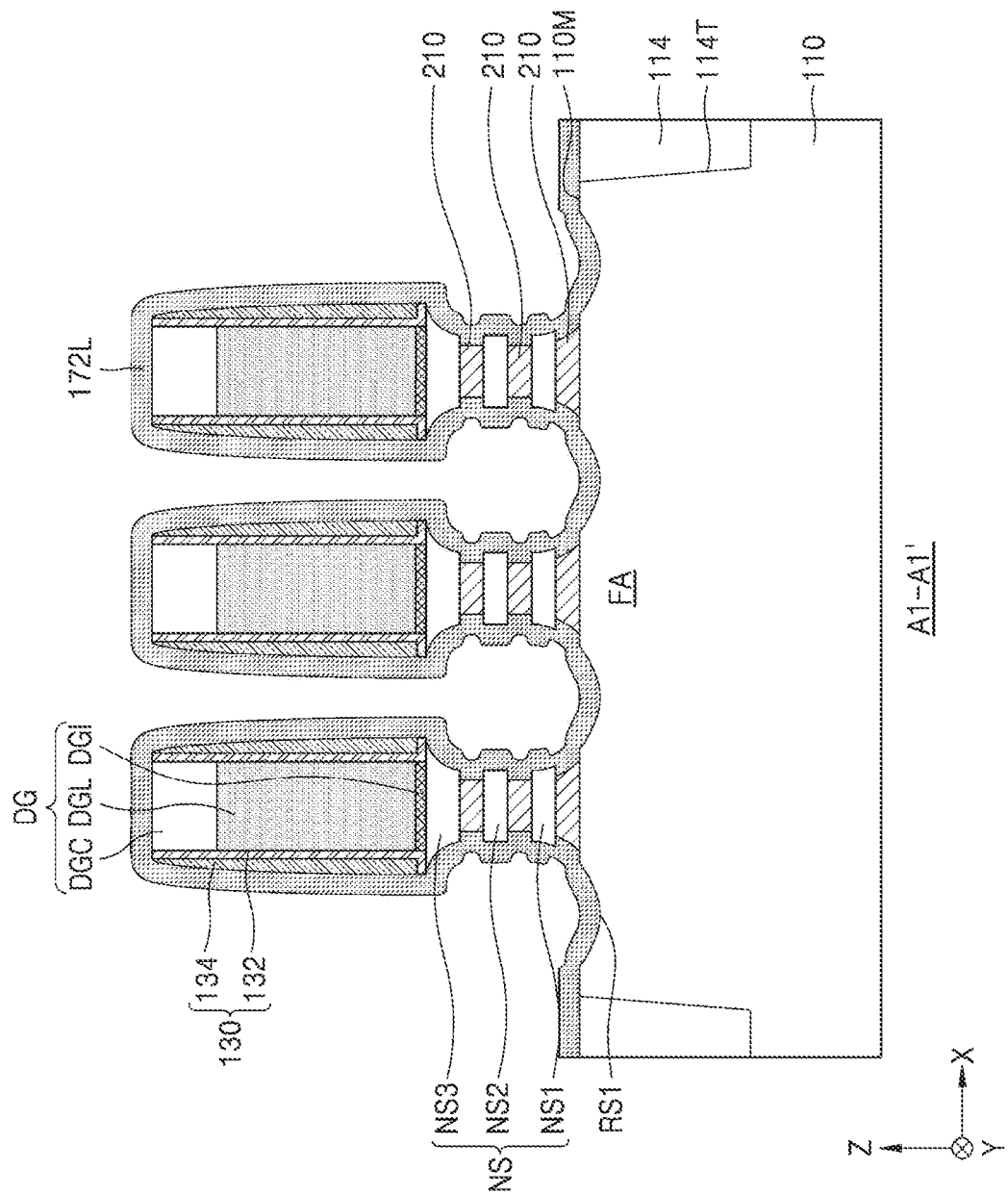
Figure 25:
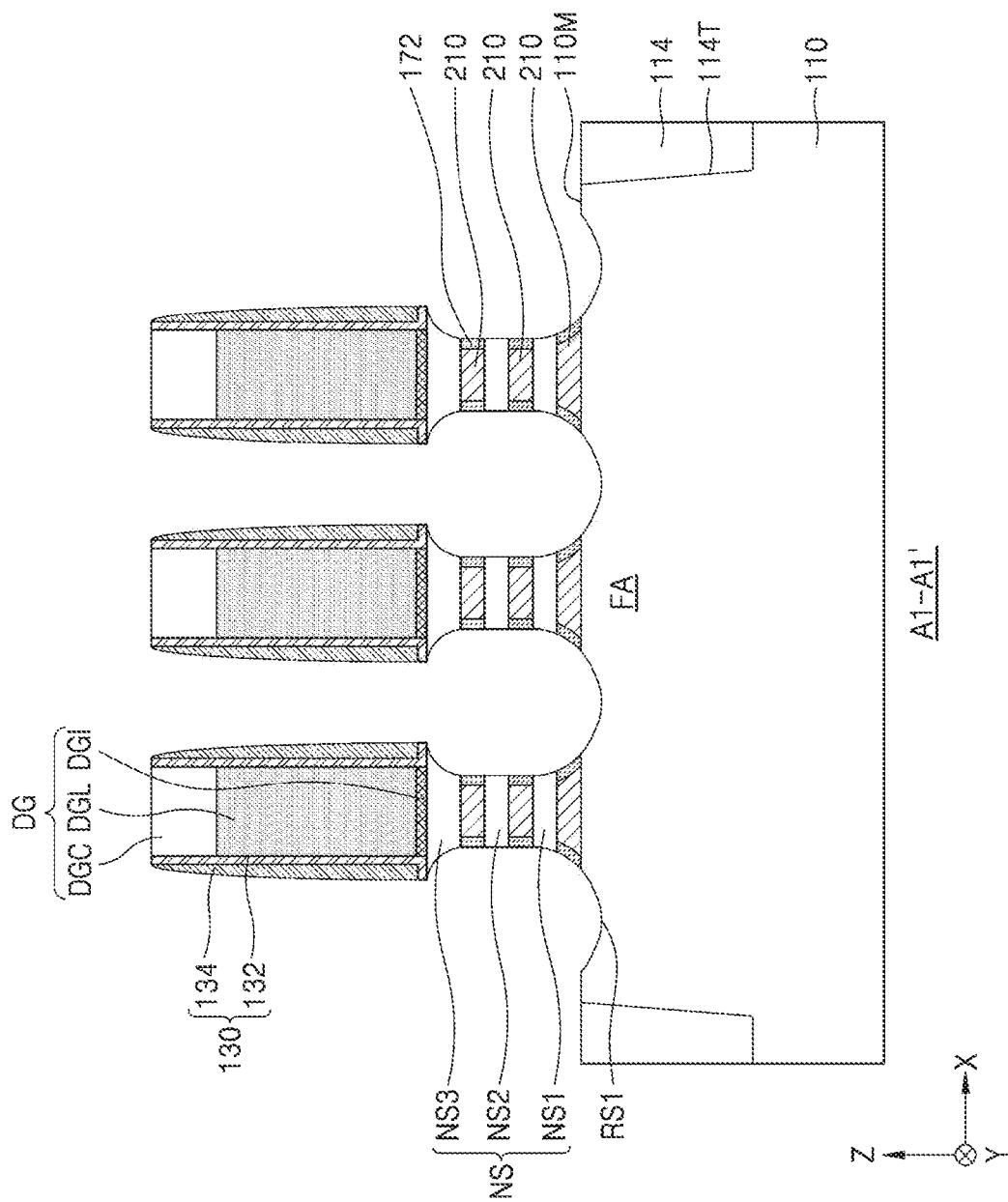

FIGS. 23 to 25 are schematic diagrams illustrating a method of manufacturing an integrated circuit device 100B, according to example embodiments.

Referring to FIG. 23, in a structure where a recess region RS1 is formed, a portion of a sacrificial layer 210 exposed to the inside of the recess region RS1 may be removed by using an anisotropic etching process, thereby forming an indent region RSE between a plurality of semiconductor patterns NS. In example embodiments, the indent region RSE may be formed by performing, for example, a wet etching process using an etch selectivity between the sacrificial layer 210 and the plurality of semiconductor patterns NS. In the wet etching process, for example, the sacrificial layer 210 including SiGe may be etched faster than the plurality of semiconductor patterns NS including Si, and thus, the indent region RSE may be formed.

Referring to FIG. 24, an inner spacer layer 172L may be conformally formed on an upper surface of a dummy gate structure DG, a sidewall of a spacer structure 130, an inner wall of the recess region RS1, and an inner wall of the indent region RSE. The inner spacer layer 172L may be formed to have a thickness sufficient to fill an inner portion of the indent region RSE. In some embodiments, the inner spacer layer 172L may have a constant thickness along the upper surface of the dummy gate structure DG and the sidewall of the spacer structure 130 as illustrated in FIG. 24.

Referring to FIG. 25, an inner spacer 172 may remain in the indent region RSE by performing an anisotropic etching process on the inner spacer layer 172L. A portion of the inner spacer layer 172L disposed on the upper surface of the dummy gate structure DG and a sidewall of the spacer structure 130 and in the recess region RS1 may be removed in the anisotropic etching process.

Subsequently, the integrated circuit device 100B may be formed by performing processes similar to the processes described above with reference to FIGS. 18A to 20B.

While the inventive concept has been particularly shown and described with reference to example embodiments thereof, it will be understood that various changes in form and details may be made therein without departing from the scope of the following claims. The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing an integrated circuit device, the method comprising:

alternately forming a plurality of channel semiconductor layers and a plurality of sacrificial layers on a substrate to form a sacrificial layer pattern that extends in a first direction parallel to an upper surface of the substrate;

forming a dummy gate structure that extends in a second direction that is perpendicular to the first direction on the sacrificial layer pattern;

forming a spacer structure on a sidewall of the dummy gate structure;

forming a recess by removing a portion of the sacrificial layer pattern adjacent to an outer sidewall of the spacer structure, wherein each of the plurality of channel semiconductor layers has a dumbbell shaped horizontal cross-sectional surface after forming the recess;

forming a source/drain region in the recess; and replacing the plurality of sacrificial layers with a gate electrode, the gate electrode comprising a main gate portion that extends on an uppermost channel semiconductor layer in the second direction and a sub-gate portion that is between adjacent ones of the plurality of channel semiconductor layers, wherein the sub-gate portion comprises:
a sub-gate center portion; and
sub-gate edge portions that comprise opposing end portions of the sub-gate portion, respectively, in the second direction, wherein the source/drain region comprises a protrusion portion protruding toward a respective one of the sub-gate edge portions, and wherein forming the spacer structure comprises:
sequentially forming a first spacer layer and a second spacer layer on an upper surface of the dummy gate structure and on the sidewall of the dummy gate structure;
forming a cover spacer layer on the second spacer layer; and
forming the spacer structure comprising a first spacer and a second spacer by performing an anisotropic etching process on the first spacer layer, the second spacer layer, and the cover spacer layer.

2. The method of claim 1, wherein the second spacer comprises a lateral extension portion that extends from the sidewall of the dummy gate structure and that extends on an upper surface of the sacrificial layer pattern in the first direction, and
wherein a portion of the cover spacer layer remains on the lateral extension portion after performing the anisotropic etching process.

3. The method of claim 2, wherein forming the spacer structure further comprises removing the portion of the cover spacer layer that remains on the lateral extension portion after performing the anisotropic etching process.

4. The method of claim 2, wherein forming the recess comprises forming a tail portion of each of the plurality of channel semiconductor layers overlapped by the dummy gate structure and the spacer structure.

5. The method of claim 4, wherein the tail portion of each of the plurality of channel semiconductor layers is thinner than a main portion of each of the plurality of channel semiconductor layers in the second direction.

6. The method of claim 4, wherein during the forming the recess, portions of the plurality of channel semiconductor layers are removed such that the plurality of channel semiconductor layers have concave sidewalls, wherein the tail portion of each of the plurality of channel semiconductor layers is defined at end portions of the concave sidewalls of the plurality of channel semiconductor layers.

7. The method of claim 2, wherein replacing the plurality of sacrificial layers with the gate electrode comprises:
forming a gate space by removing the dummy gate structure;
forming a sub-gate space between the adjacent ones of the plurality of channel semiconductor layers by removing the plurality of sacrificial layers exposed to the gate space; and
forming the main gate portion and the sub-gate portion in the gate space and the sub-gate space, respectively.

8. The method of claim 7, wherein an edge of the sub-gate portion that is vertically overlapped by the spacer structure comprises a tail portion.

9. The method of claim 8, wherein the tail portion of the sub-gate portion is a taper portion protruding toward the source/drain region.

10. The method of claim 1, wherein the plurality of channel semiconductor layers comprises silicon and the plurality of sacrificial layers comprises silicon germanium.

11. A method of manufacturing an integrated circuit device, the method comprising:
alternately forming a plurality of channel semiconductor layers and a plurality of sacrificial layers on a substrate to form a sacrificial layer pattern that extends in a first direction parallel to an upper surface of the substrate;
forming a dummy gate structure that extends in a second direction that is perpendicular to the first direction on the sacrificial layer pattern;
sequentially forming a first spacer layer and a second spacer layer on an upper surface of the dummy gate structure and on a sidewall of the dummy gate structure;
forming a cover spacer layer on the second spacer layer;
forming a spacer structure on the sidewall of the dummy gate structure by performing an anisotropic etching process on the first spacer layer, the second spacer layer, and the cover spacer layer, wherein the spacer structure comprises a first spacer and a second spacer;
forming a recess by removing a portion of the sacrificial layer pattern adjacent to an outer sidewall of the spacer structure, wherein each of the plurality of channel semiconductor layers has a dumbbell shaped horizontal cross-sectional surface after forming the recess;
forming a source/drain region in the recess; and
replacing the plurality of sacrificial layers with a gate electrode.

12. The method of claim 11, wherein the second spacer comprises a lateral extension portion that extends from the sidewall of the dummy gate structure and that extends on an upper surface of the sacrificial layer pattern in the first direction, and
wherein a portion of the cover spacer layer remains on the lateral extension portion after performing the anisotropic etching process.

13. The method of claim 12, wherein forming the spacer structure further comprises removing the portion of the cover spacer layer that remains on the lateral extension portion after performing the anisotropic etching process.

14. The method of claim 12, wherein forming the recess comprises forming a tail portion of each of the plurality of channel semiconductor layers overlapped by the dummy gate structure and the spacer structure.

15. The method of claim 14, wherein the tail portion of each of the plurality of channel semiconductor layers is thinner than a main portion of each of the plurality of channel semiconductor layers in the second direction.

16. The method of claim 14, wherein during the forming the recess, portions of the plurality of channel semiconductor layers are removed such that the plurality of channel semiconductor layers have concave sidewalls,
wherein the tail portion of each of the plurality of channel semiconductor layers is defined at end portions of the concave sidewalls of the plurality of channel semiconductor layers.

17. The method of claim 11, wherein the gate electrode comprises a main gate portion that extends on an uppermost channel semiconductor layer in the second direction and a sub-gate portion that is between adjacent ones of the plurality of channel semiconductor layers,
wherein the sub-gate portion comprises:
a sub-gate center portion; and
sub-gate edge portions that comprise opposing end portions of the sub-gate portion, respectively, in the second direction,
wherein the source/drain region comprises a protrusion portion protruding toward a respective one of the sub-gate edge portions.

18. The method of claim 17, wherein replacing the plurality of sacrificial layers with the gate electrode comprises:
forming a gate space by removing the dummy gate structure;
forming a sub-gate space between the adjacent ones of the plurality of channel semiconductor layers by removing the plurality of sacrificial layers exposed to the gate space; and
forming the main gate portion and the sub-gate portion in the gate space and the sub-gate space, respectively.

19. The method of claim 17, wherein the sub-gate portion has a dumbbell shaped horizontal cross-sectional surface, and
wherein the uppermost channel semiconductor layer comprises a concave sidewall that contacts the protrusion portion of the source/drain region.

* * * * *